(12) United States Patent
Awata

(10) Patent No.: US 7,738,985 B2
(45) Date of Patent: Jun. 15, 2010

(54) PRODUCTION CONDITION DETERMINING METHOD, PRODUCTION CONDITION DETERMINING APPARATUS, MOUNTER, AND PROGRAM

(75) Inventor: Yoshiaki Awata, Fukuoka (JP)

(73) Assignee: Panasonic Corporation, Osaka (JP)

( * ) Notice: Subject to any disclaimer, the term of this patent is extended or adjusted under 35 U.S.C. 154(b) by 176 days.

(21) Appl. No.: 11/914,280

(22) PCT Filed: Jun. 22, 2006

(86) PCT No.: PCT/JP2006/312943

§ 371 (c)(1),
(2), (4) Date: Nov. 13, 2007

(87) PCT Pub. No.: WO2007/004494

PCT Pub. Date: Jan. 11, 2007

(65) Prior Publication Data

US 2009/0062951 A1    Mar. 5, 2009

(30) Foreign Application Priority Data

Jul. 5, 2005    (JP)    ............................. 2005-196661

(51) Int. Cl.
G06F 19/00    (2006.01)
(52) U.S. Cl. ........................... 700/103; 700/105; 703/6; 716/8
(58) Field of Classification Search ................ 700/95, 700/103, 105, 111, 121; 702/81, 82; 716/1, 716/2, 4, 8, 10; 703/6, 7, 13, 14; 29/709, 29/711, 739, 740, 742, 832
See application file for complete search history.

(56) References Cited

U.S. PATENT DOCUMENTS 6,829,514 B2 * 12/2004 Gyorfi et al. ................ 700/103

(Continued)

FOREIGN PATENT DOCUMENTS

JP    5-181517    7/1993

(Continued)

OTHER PUBLICATIONS

International Search Report issued Jan. 29, 2007 in the International (PCT) Application of which the present application is the U.S. National Stage.

(Continued)

*Primary Examiner*—Charles R Kasenge
(74) *Attorney, Agent, or Firm*—Wenderoth, Lind & Ponack, L.L.P.

(57) ABSTRACT

This invention provides a production condition determining method by which a production schedule of boards can be determined in a short time. The production condition determining method is for determining production conditions, under which various types of boards are to be produced. This method includes: judging whether or not all of part feeders necessary to produce the various types of boards can be stored simultaneously in part supplying units in a mounter, by comparing the number of the necessary part feeders, with the number of part feeders which can be stored in the part supplying units; and outputting a guidance for modifying the production conditions so that the various types of boards can be produced, when the judgment is made that all of the necessary part feeders cannot be stored simultaneously in the part supplying units.

12 Claims, 21 Drawing Sheets

U.S. PATENT DOCUMENTS

| | | | |
|---|---|---|---|
| 6,865,803 B2* | 3/2005 | Hidese | 29/832 |
| 7,127,382 B2 | 10/2006 | Kikuchi et al. | |
| 7,395,129 B2* | 7/2008 | Yamazaki et al. | 700/111 |
| 2002/0042989 A1* | 4/2002 | Kawase et al. | 29/832 |
| 2004/0073322 A1* | 4/2004 | Maenishi et al. | 700/96 |
| 2004/0143352 A1* | 7/2004 | Gyorfi et al. | 700/99 |
| 2006/0052893 A1* | 3/2006 | Yamazaki et al. | 29/743 |

FOREIGN PATENT DOCUMENTS

| | | |
|---|---|---|
| JP | 7-022774 | 1/1995 |
| JP | 9-008492 | 1/1997 |
| JP | 9-312494 | 12/1997 |
| JP | 11-177281 | 7/1999 |
| JP | 2003-023300 | 1/2003 |

OTHER PUBLICATIONS

Written Opinion of the International Searching Authority issued Jun. 22, 2006 in PCT/JP2006/312943 of which the present application is the U.S. National Stage.

* cited by examiner

FIG. 6

| Part Name | (Part View) | Part Size (mm) | | | Two-Dimensional Recognition Method | Stiction Nozzle | Tact Time (秒) | Speed XY |
|---|---|---|---|---|---|---|---|---|
| | | X | Y | L | | | | |
| 0603CR | | 0.6 | 0.3 | 0.25 | | SX | 0.086 | 1 |
| 1005CR | | 1.0 | 0.5 | 0.3-0.5 | | SA | | |
| 1608CR | | 1.6 | 0.8 | 0.4-0.8 | | S | 0.094 | |
| 2012CR | | 2.0 | 1.25 | 0.4-0.8 | | | | |
| 3216CR | | 3.2 | 1.6 | 0.4-0.8 | Reflection | | | |
| 4TR | | 2.8 | 2.8 | 1.1 | | Cylinder Chip | 0.11 | |
| 6TR | | 4.3 | 4.5 | 1.5 | | | | |
| 1TIP | | 2.0 | φ1.0 | - | | | | |
| 2TIP | | 3.6 | φ1.4 | - | | | | |
| 1CAP | | 3.8 | 1.9 | 1.6 | | S | | |
| 2CAP | | 4.7 | 2.6 | 2.1 | | | | |
| 3CAP | | 6.0 | 3.2 | 2.5 | | | | |
| 4CAP | | 7.3 | 4.3 | 2.8 | | M | | |
| SCAP | | 4.3 | 4.3 | 6.0 | | | | |
| LCAP | | 6.6 | 6.6 | 6.0 | | | | |
| LLCAP | | 10.3 | 10.3 | 10.5 | | ML | | |
| 1VOL | | 4.5 | 3.8 | 1.6-2.4 | | M | 0.13 | 2 |
| 2VOL | | 3.7 | 3.0 | 1.6 | | | | |
| 3VOL | | 4.8 | 4.0 | 3.0 | | | | |

| Part Name | Slot No. |
|---|---|
| 0603CR | 5 |
| 1005CR | 8 |
| 1608CR | 4 |
| 2012CR | 22 |

FIG. 13

Part List (Non-Storable Part List)

● Per board  ○ All boards board name: C07PCB-7

[dropdown options: C01PCB-1, C02PCB-2, C03PCB-3, C04PCB-4, C05PCB-5, C06PCB-6, C07PCB-7]

| No | | ame | length (L) | width (W) | thickness (T) | chip type | feeder type | tape type | tape feeder N | reel size | feed pitch | mounting point number |
|---|---|---|---|---|---|---|---|---|---|---|---|---|
| 1 | K2 | _t0.35 | 1.00 | 1.00 | 0.35 | registance network | tape | paper | 8 | small | 2 | 1 |
| 2 | K2 | 0.50 | 2.00 | 1.25 | 0.50 | fixed registance | tape | paper | 8 | small | 4 | 1 |
| 3 | K25 | R2125_t0.50 | 2.00 | 1.25 | 0.50 | fixed registance | tape | paper | 8 | small | 4 | 1 |
| 4 | K339764 | C1608_t0.80 | 1.60 | 0.80 | 0.80 | capacitor | tape | paper | 8 | small | 4 | 1 |
| 5 | K558896 | C1608_t0.80 | 1.60 | 0.80 | 0.80 | capacitor | tape | paper | 8 | small | 4 | 1 |
| 6 | K336934 | NR2125_t0.50 | 2.00 | 1.00 | 0.35 | registance network | tape | paper | 8 | small | 2 | 1 |
| 7 | K12A587 | NR2125_t0.50 | 2.00 | 1.00 | 0.35 | registance network | tape | paper | 8 | small | 2 | 1 |
| 8 | K459375 | R2125_t0.50 | 2.00 | 1.25 | 0.50 | fixed registance | tape | paper | 8 | small | 4 | 1 |
| 9 | K698754 | C1005_t0.55 | 1.00 | 0.50 | 0.50 | capacitor | tape | paper | 8 | small | 2 | 1 |
| 10 | K10005 | NR1010_t0.35 | 1.00 | 1.00 | 0.35 | registance network | tape | paper | 8 | small | 2 | 1 |
| 11 | K000345 | MTr2819_t1.15 | 2.80 | 1.90 | 1.15 | mini-Tr | tape | embossment (standard) | 12 | big | 8 | 1 |
| 12 | K470535 | SOP6051_t1.55 | 6.00 | 5.15 | 1.55 | SOP | tape | embossment (standard) | 12 | small | 4 | 1 |
| 13 | K100215 | R2125_t0.50 | 2.00 | 1.25 | 0.50 | fixed registance | tape | paper | 8 | small | 4 | 1 |
| 14 | K410032 | Di3409_t0.80 | 3.45 | 0.90 | 0.80 | diode | tape | embossment (standard) | 8 | small | 4 | 1 |
| 15 | K300295 | SOP6050_t1.60 | 6.00 | 5.00 | 1.60 | SOP | tape | paper | 12 | big | 8 | 1 |
| 16 | K364702 | C2125_t01.20 | 2.00 | 1.25 | 1.20 | capacitor | tape | embossment (standard) | 8 | small | 4 | 1 |
| 17 | K364702 | C2125_t01.20 | 2.00 | 1.25 | 1.25 | capacitor | tape | embossment (standard) | 8 | small | 4 | 1 |
| 18 | K101375 | SOP6051_t1.55 | 6.50 | 5.37 | 1.55 | SOP | tape | embossment (standard) | 12 | big | 8 | 1 |
| 19 | K101375 | R3216_t0.55 | 3.20 | 1.60 | 0.55 | fixed registance | tape | paper | 8 | small | 4 | 1 |
| 20 | K364702 | SOP5032_t1.00 | 4.90 | 3.20 | 1.00 | SOP | tape | embossment (standard) | 12 | big | 8 | 1 |
| 21 | K240221 | C6125_t2.3 | 6.10 | 2.50 | 2.30 | capacitor | tape | embossment (standard) | 12 | small | 4 | 1 |
| 22 | K220330 | CN5050_t4.9 | 5.00 | 5.00 | 4.90 | capacitor | tape | embossment (standard) | 12 | big | 12 | 1 |
| 23 | K060280 | Tr1511_t3.3 | 15.60 | 11.60 | 2.20 | transformer | tape | embossment (standard) | 24 | big | 24 | 1 |
| 24 | K050072 | CHI6060_3.3 | 6.00 | 6.00 | 3.30 | chip inductor | tape | embossment (standard) | 12 | tape | 12 | 1 |
| 25 | K470630 | A170G3_t5.8 | 7.00 | 6.60 | 5.80 | aluminum electrolytic | tape | embossment (standard) | 16 | big | 12 | 1 |
| 26 | K670395 | SOP9918_t2.30 | 9.90 | 18.60 | 2.30 | SOP | tape | embossment (standard) | 24 | big | 12 | 1 |
| 27 | K345019 | SOP6049_t1.64 | 6.00 | 4.90 | 1.64 | SOP | tape | embossment (standard) | 12 | big | 8 | 1 |
| 28 | K450191 | SOPE010_t1.80 | 8.00 | 10.20 | 1.80 | SOP | tape | embossment (standard) | 16 | big | 12 | 1 | selection record 0 | standard display

Search (S)   Detail»   OK

FIG. 18

| Mounter Name | | 1 | M-1 2 | 3 | 4 | 1 | M-2 2 | 3 | 4 | 1 | M-3 2 | 3 | 4 | 1 | M-4 2 |
|---|---|---|---|---|---|---|---|---|---|---|---|---|---|---|---|
| Whole Schedule | mounting point | 161 | 275 | 282 | 218 | 260 | 180 | 200 | 83 | 14 | 9 | 5 | 308 | 29 | 29 |
| | tact time | 23 | 42.6 | 43 | 62.8 | | 40.4 | 43 | 47.9 | | 9.0 | | 137.6 | | 64.1 |
| | turn | | 35 | | 34 | 36 | 29 | | 14 | 6 | 5 | 3 | 104 | | 36 |
| 001PCB-4 | mounting point | 31 | 95 | 68 | 54 | 84 | 63 | 51 | 17 | 4 | 1 | 1 | 151 | 10 | 9 |
| | tact time | 5 | 36.6 | 19 | 39.9 | 13 | 39.0 | 18 | 35.6 | 2 | 7.3 | 1 | 137.3 | | 59.6 |
| | turn | | 12 | | 10 | | 11 | | 3 | | 1 | | 51 | | 11 |
| 002PCB-5 | mounting point | 31 | 95 | 68 | 54 | 84 | 63 | 51 | 17 | 4 | 1 | 1 | 151 | 10 | 9 |
| | tact time | 5 | 36.6 | 19 | 32.1 | 11 | 36.4 | 9 | 26.3 | 2 | 7.3 | 3 | 137.6 | | 64.1 |
| | turn | | 12 | | 10 | | 11 | | 3 | | 1 | | 51 | | 12 |
| 003PCB-6 | mounting point | 99 | 95 | 146 | 110 | 92 | 54 | 98 | 49 | 6 | 7 | 3 | 6 | 9 | 11 |
| | tact time | 13 | 42.6 | 19 | 62.8 | 12 | 40.4 | 16 | 47.9 | 2 | 9.0 | 1 | 9.8 | | 61.1 |
| | turn | | 11 | | 14 | | 7 | | 8 | | 3 | | 2 | | 13 |

PRODUCTION CONDITION DETERMINING METHOD, PRODUCTION CONDITION DETERMINING APPARATUS, MOUNTER, AND PROGRAM

TECHNICAL FIELD

The present invention relates to a method of determining production conditions for a mounter which mounts parts on a board, and more particularly to a method of determining production conditions when various types of boards are to be produced.

BACKGROUND ART

Conventionally, a part placement method has been proposed in order to efficiently produce multiple types of boards by a mounting line having a great number of mounters, each of which mounts electronic components (hereinafter, referred to as parts) on a board, as disclosed in Japanese Patent Application Laid-Open No. 7-22774, for example. By this conventional part placement method, parts to be mounted on all of the multiple types of boards (hereinafter, referred to as "common parts") are grouped in an order of user frequency and in an order of speeds, thereby deciding a placement position of a part feeder for the common parts. Thereby, it becomes no longer necessary to prepare each part feeder of the common parts for each board, to be set in a part supplying unit in the mounter. Accordingly, it is possible to reduce the number of times of interchanging the feeders when a type of the board is to be changed, thereby efficiently producing the board.

However, if there are a great number of types of boards, due to constraints on the number of part feeders which are able to be stored in the mounter, all of the part feeders are not always able to be stored in the mounter. Whether or not all of the part feeders can be stored is unknown until processing for deciding placement of the part feeder is performed. More specifically, if the placement of all of the part feeders can be decided, all of the part feeders can be stored in the mounter, and if not, some of the part feeders are not able to be stored in the mounter.

However, this processing is quite time consuming. For example, in order to facilitate operations performed by an operator to place the part feeders in the part supplying unit, various processing is necessary, such as processing for grouping parts which have a similar size or shape, and processing for deciding an order of the placement of the part feeders in order to minimize a mounting time for each board type in the same group. Moreover, those processing need to be performed in trial-and-error processes. For this reason, a lot of time is required to know whether or not all part feeders can be stored in the mounter, and if some part feeders cannot be stored in the mounter, a production schedule of boards is modified, for example by reducing the number of board types to be produced, in order to re-perform the processing for deciding the placement positions of the part feeders. Therefore, there is a problem that a quite lot of time is required to decide a production schedule of boards.

The present invention is conceived to solve the above problem, and an object of the present invention is to provide a production condition determining method by which placement of the part feeders can be decided in a short time, by judging at an early stage whether or not the part feeders can be stored in the part supplying unit, and by adopting an interactive system for communicating with an operator.

DISCLOSURE OF INVENTION

A production condition determining method according to the present invention determines production conditions under which various types of boards are to be produced, wherein under initial conditions of the production conditions, all of necessary part feeders are to be stored simultaneously in a part supplying unit in a mounter. Here, the necessary part feeders are used to produce the various types of boards, and the mounter produces the various types of boards. The method includes: judging whether or not all of the necessary part feeders can be stored simultaneously in the part supplying unit, by comparing the number of the necessary part feeders, with the number of part feeders which can be stored in the part supplying unit; and outputting a guidance for modifying the production conditions so that the various types of boards can be produced, when the judgment is made that all of the necessary part feeders cannot be stored simultaneously in the part supplying unit.

By the above method, without conventionally performing processing for deciding the placement positions of the part feeders, it is possible to judge whether or not the part feeders can be simultaneously stored in the part supplying unit, so that a schedule of producing various types of boards can be made in a short time.

It is preferable that, in said outputting, information is displayed to specify any of the part feeders which cannot be stored simultaneously in the part supplying unit, according to the judgment in said judging.

By the above method, it is possible to know which parts are not able to be stored in the part supplying unit. This enables the operator to easily decide a type of board to be eliminated from the production schedule, or to easily specify a mounter having a part feeder to be interchanged, according to characteristics of the part.

That is, in said outputting, guidance may be displayed to set interchanging of the part feeders stored in the part supplying unit, when one of the board types is switched to another to be produced, and also in said outputting, guidance may be displayed to set deleting of one of the board types not to be produced.

Note that the present invention can be realized not only as the production condition determining method including the above-described processing, but also as a production condition determining apparatus having units which perform the processing of the production condition determining method, a program causing a computer to execute the processing, and the like. Here, it is obvious that the program can be distributed via a recording medium such as a Compact Disc-Read Only Memory (CD-ROM), or a transmission medium such as the Internet.

Accordingly, the present invention can provide a production condition determining method by which placement of part feeders can be decided in a short time, by judging at an early stage whether or not the part feeders can be stored in a part supplying unit, and by adopting an interactive system for communicating with an operator.

FURTHER INFORMATION ABOUT TECHNICAL BACKGROUND TO THIS APPLICATION

The disclosure of Japanese Patent Application No. 2005-196661 filed on Jul. 5, 2005 including specification, drawings and claims is incorporated herein by reference in its entirety.

BRIEF DESCRIPTION OF DRAWINGS

These and other objects, advantages and features of the present invention will become apparent from the following description thereof taken in conjunction with the accompanying drawings that illustrate a specific embodiment of the present invention. In the Drawings:

FIG. 6 is a table showing one example of a part library;

FIG. 7 is a table showing one example of placement position data of a part feeder;

FIG. 13 is a diagram showing one example of a screen displaying a list of parts which are not able to be stored;

FIG. 18 is a diagram showing one example of an execution result display screen of simulation;

BEST MODE FOR CARRYING OUT THE INVENTION

The following describes a mounting system according to an embodiment of the present invention with reference to the drawings.

Figure 1:
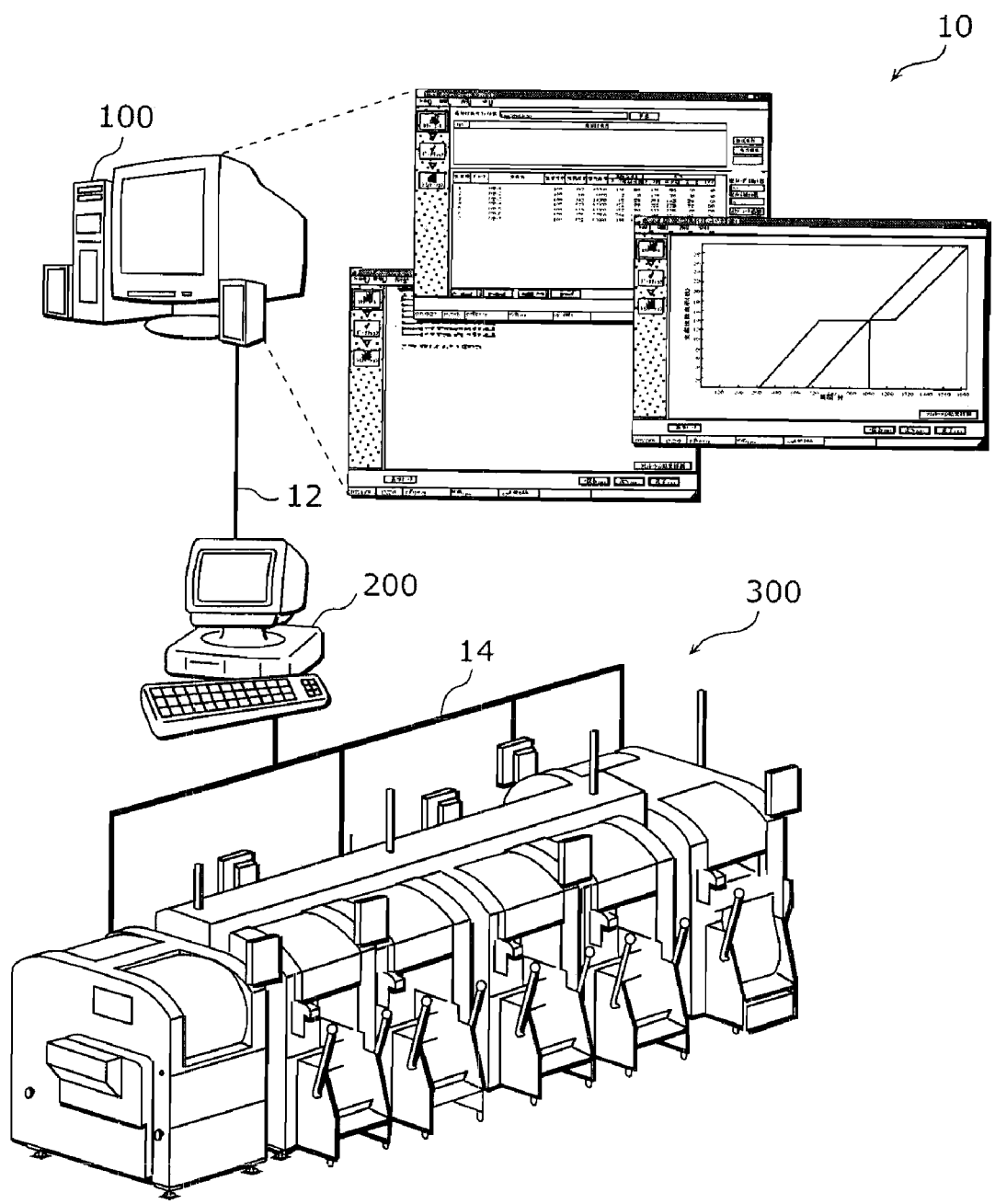
FIG. 1 is a schematic diagram showing a configuration of a mounting system according to an embodiment of the present invention.

FIG. 1 is a schematic diagram showing a configuration of a mounting system according to the embodiment of the present invention.

A mounting system 10 according to the embodiment is a system for mounting electronic parts on a board to produce a board mounted with the electronic parts. The mounting system 10 includes a data generation terminal apparatus 100, a line management terminal apparatus 200, and a mounting line 300.

The mounting line 300 has plural mounters. Each of the mounters mounts electronic parts sequentially on a board to produce a board mounted with the electronic parts.

The line management terminal apparatus 200 is a computer which manages processes performed by each mounter in the mounting line 300.

The data generation terminal apparatus 100 is a computer which generates production conditions and the like, to be applied in each mounter when a board mounted with electronic parts is produced. Here, examples of the "production conditions" are placement of part feeders in a part supplying unit of the mounter, an order of changing the placement of part feeders when a type of board to be produced is to be changed, a production schedule of boards, and the like. Since processing performed by the data generation terminal apparatus 100 is critical in the present invention, the processing is described in detail further below.

The data generation terminal apparatus 100 and the line management terminal apparatus 200 are connected with each other via a network 12. Likewise, the line management terminal apparatus 200 and each of the mounters in the mounting line 300 are connected with each other via a network 14.

The production conditions and the like generated by the data generation terminal apparatus 100 are downloaded to the line management terminal apparatus 200 via the network 12. Then, the line management terminal apparatus 200 controls the mounting line 300, based on the downloaded production conditions and the like, in order to produce boards mounted with electronic parts.

Next, the mounter in the mounting line 300 is described with reference to the drawings.

Figure 2:
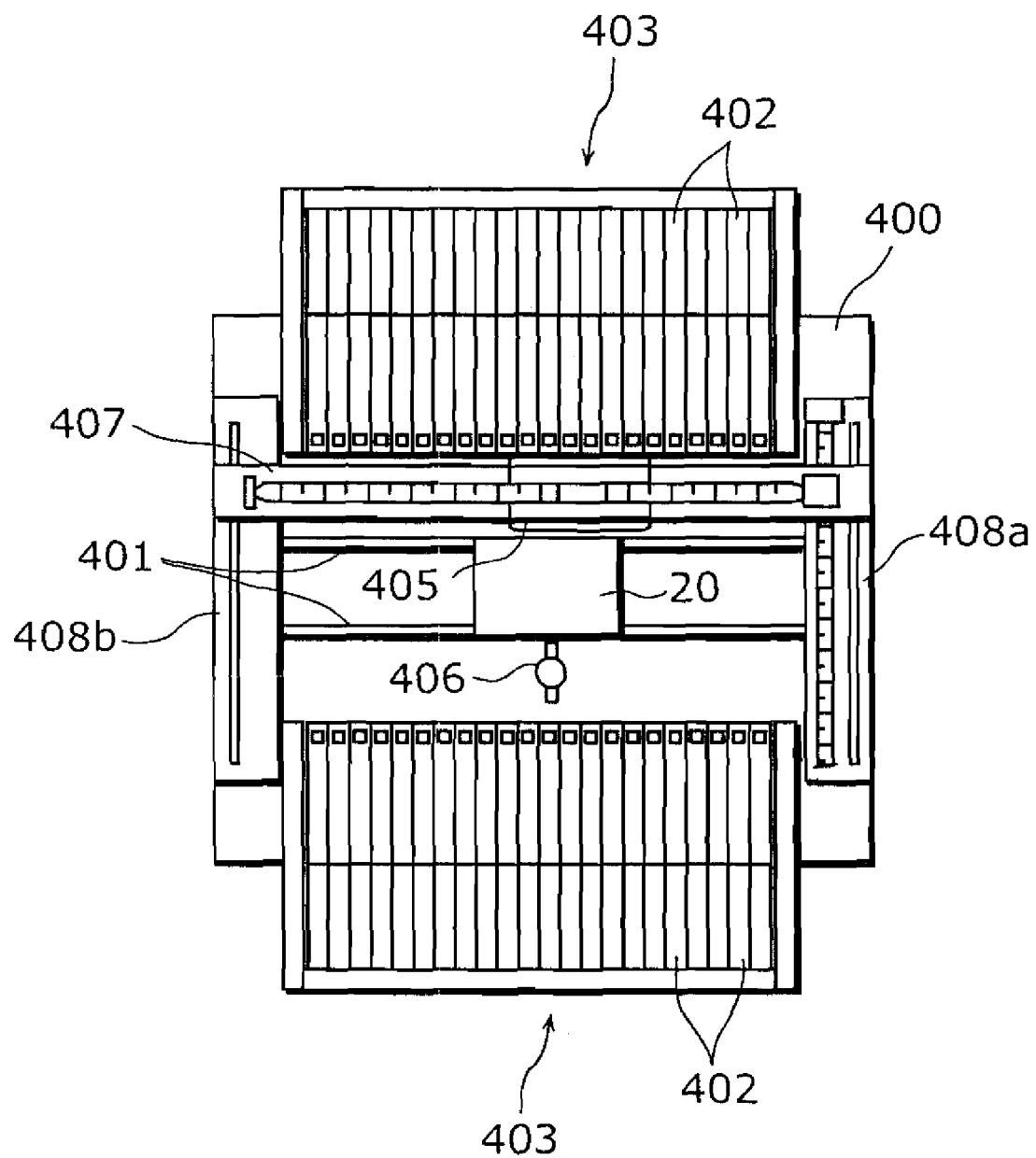
FIG. 2 is a top plan view showing an internal structure of a mounter.

FIG. 2 is a top plan view showing an internal structure of the mounter. This mounter includes a base 400, a transportation path 401, part supplying units 403, a line gang pickup head 405, a recognition camera 406, an X-axis table 407, a Y-axis table 408a, and a slide guide 408b. The transportation path 401, which is placed on a center of the base 400, transports a board 20 and decides a position of the board on the base 400. Each of the part supplying units 403 has plural part feeders 402 for supplying various types of parts. The line gang pickup head 405 has nozzles which pick up parts from the part feeders 402 in the part supplying unit 403, then transport the parts to mounting points on the board 20, and mount the parts onto the board 20. The recognition camera 406 investigates the picked-up state of the parts that have been picked Lip by the line gang pickup head 405, from under the parts. The X-axis table 407 moves the line gang pickup head 405 in an X direction along the transportation path 401. The X-axis table 407 is placed astride the Y-axis table 408a and the slide guide 408b. The Y-axis table 408a and the slide guide 408b move the X-axis table 407 in a Y direction that is perpendicular to the X direction.

Figure 3:
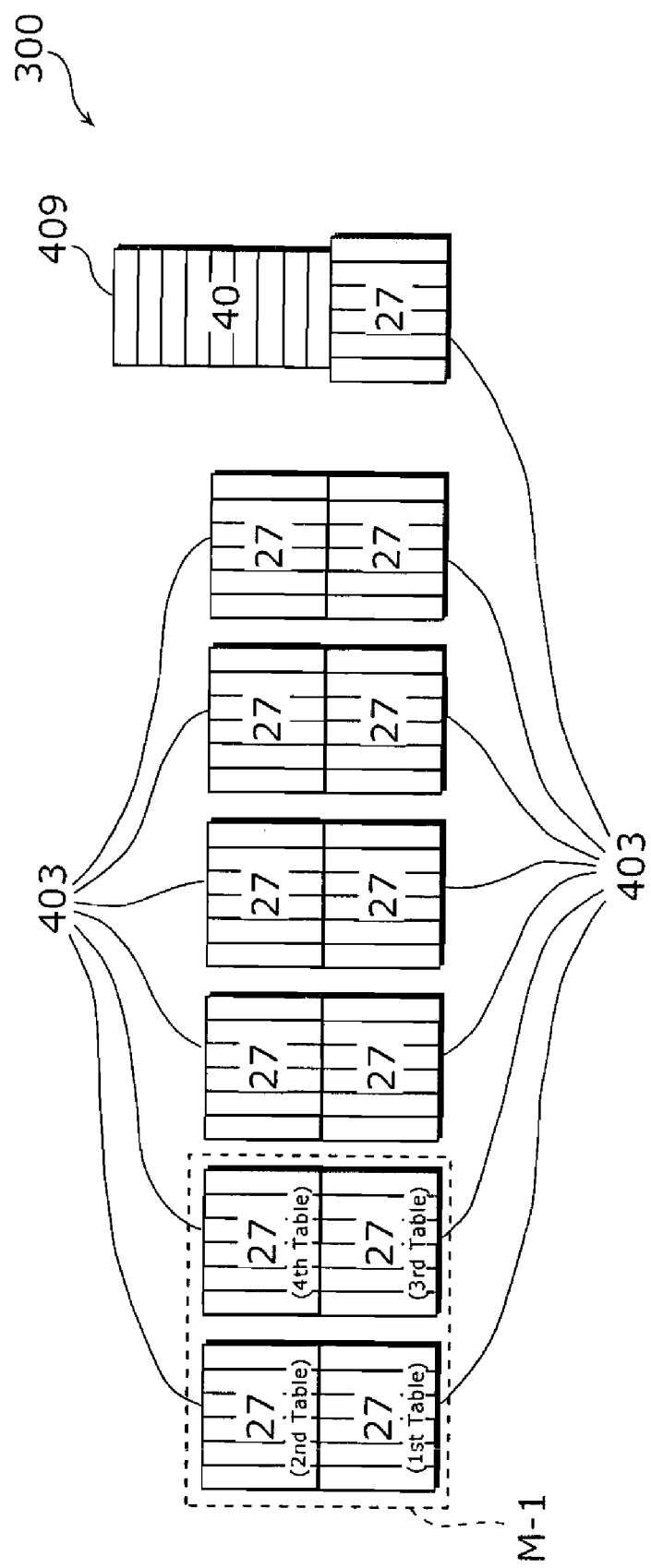
FIG. 3 is a schematic diagram showing only a part supplying unit in the mounter included in a part mounting line.

FIG. 3 is a schematic diagram showing only the part supplying units in the mounters in the part mounting line 300. Here, the mounting line 300 has seven mounters. Among the mounters, each of six mounters from the upstream has two part supplying units 403, each of which can store twenty-seven part feeders 402. On the other hand, the other mounter in the downstream has one part supplying unit 403 for storing twenty-seven part feeders 402, and another part supplying unit 409 for storing forty part trays. This means that the mounting line 300 can store 27×2×6+27=351 part feeders 402 and forty part trays at once.

Next, a structure of the data generation terminal apparatus 100 is described.

Figure 4:
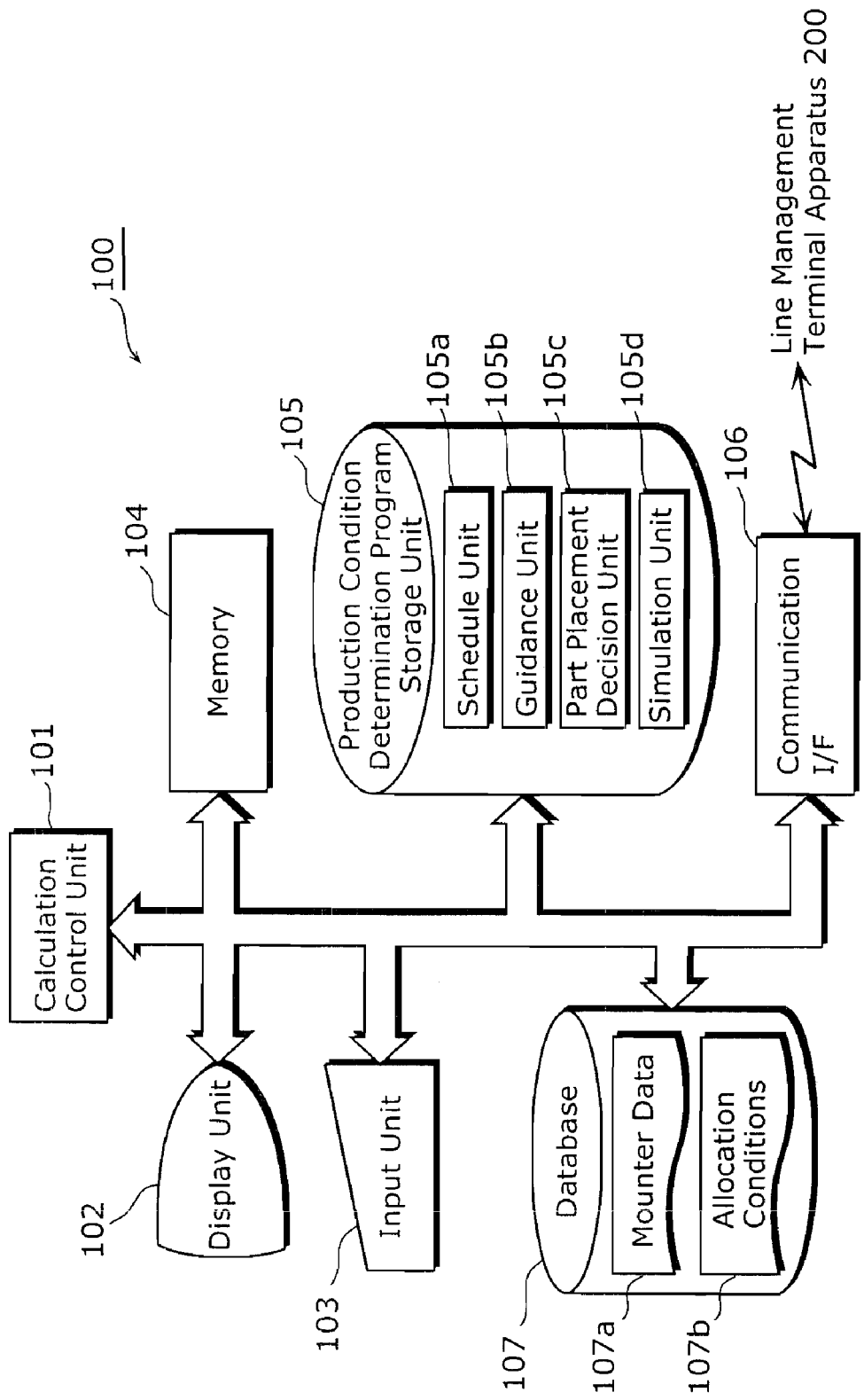
FIG. 4 is a block diagram showing a structure of a data generation terminal apparatus.

FIG. 4 is a block diagram showing the structure of the data generation terminal apparatus 100. The data generation terminal apparatus 100 includes a calculation control unit 101, a display unit 102, an input unit 103, a memory 104, a production condition determination program storage unit 105, a communication interface (I/F) 106, a database 107, and the like.

The calculation control unit 101 is, for example, a Central Processing Unit (CPU), a numeric value processor, or the like. According to instructions or the like from an operator, the calculation control unit 101 downloads a program necessary for the memory 104, from the production condition determination program storage unit 105, and then executes the program. Based on a result of the program execution, the calculation control unit 101 controls the other units 102 to 107.

The display unit 102 is, for example, a Cathode-Ray Tube (CRT), a Liquid Crystal Display (LCD), or the like. The input unit 103 is, for example, a keyboard, a mouse, or the like. The display unit 102 and the input unit 103 are used under the control of the calculation control unit 101, so that the data generation terminal apparatus 100 and the operator can communicate with each other, for example.

The communication I/F 106 is, for example, a Local Area Network (LAN) adapter, or the like, which is used when the data generation terminal apparatus 100 and the line management terminal apparatus 200 communicates with each other, for example. The memory 104 is, for example, a Random Access Memory (RAM) or the like, which provides a working area for the calculation control unit 101.

The database 107 is a hard disk or the like, which stores, for example, input data (mounter data 107a, allocation conditions 107b, and the like), which are used when the data generation terminal apparatus 100 generates the production conditions and the like, and results of the generating of the production conditions and the like.

Here, the mounter data 107a is a program which is generated for each board type to be produced, in order to operate each mounter to produce the board type. Examples of the mounter data 107a are numeric control (NC) data indicating mounting points of parts, data indicating placement positions and the like of the part feeders 402, and the like.

Figure 5:
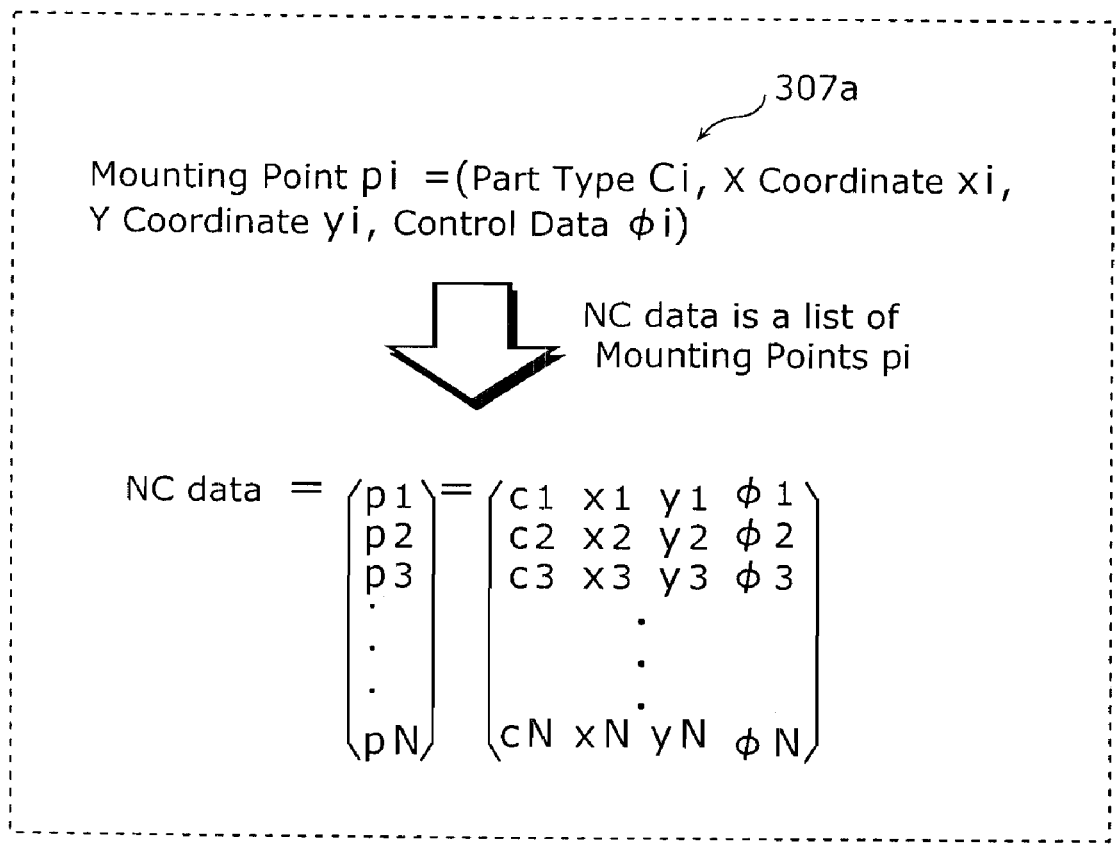
FIG. 5 is a diagram showing one example of NC data.

FIG. 5 is a diagram showing one example of the NC data. NC data 307a is collection of information indicating mounting points of all parts to be mounted. As shown in FIG. 5, one mounting point pi is expressed by a part type $C_i$, X coordinates $x_i$, Y coordinates $y_i$, and control data $\phi_i$. Here, the "part type" is equivalent to a part name in a part library 307b shown in FIG. 6. The "X coordinates" and the "Y coordinates" are coordinates of the mounting point (coordinates indicating a specific position on a board). The "control data" is information of constraints on mounting of the part type (a type of an applicable nozzle, a maximum moving speed of the line gang pickup head 405, and the like).

The part library 307b is a library indicating information unique to each type of part which can be treated by the mounters. As shown in FIG. 6, the part library 307b indicates, per part type, a part size, a tact time (tact time required for each part type under certain conditions), and other constraint information (a type of an applicable nozzle, a recognition method by the recognition camera 406, a maximum speed ratio of the line gang pickup head 405, and the like). In FIG. 6, an external view of each part type is added as a reference. The part library may include information regarding a color or a shape of each part type.

FIG. 7 is a table showing one example of placement position data regarding the part feeder 402. The placement position data indicates slot numbers regarding the part supplying units 403. The slot numbers are allocated to respective part feeders 402 to be placed in the part supplying unit 403. The placement position data includes part names indicating names of part types stored in respective part feeders 402, and slot numbers of the part supplying unit 403 in which the respective part feeders 402 are to be placed. The part feeders 402 should be placed according to the placement position data.

The allocation conditions 107b are conditions indicating to which mounter the part types are to be allocated, in other words, how the part types are to be allocated to the respective part feeders in the respective mounters.

The production condition determination program storage unit 105 is a hard disk, or the like, which stores various kinds of production condition determination programs to realize functions of the data generation terminal apparatus 100. As a processing unit executed by the calculation control unit 101, the production condition determination program storage unit 105 functionally includes a schedule unit 105a, a guidance unit 105b, a part placement decision unit 105c, a simulation unit 105d, and the like.

The schedule unit 105a performs processing for registering the various data into the database 107. Outputting (displaying) guidance to the operator based on the data registered in the database 107, the guidance unit 105b modifies the mounter data 107a and sets the allocation conditions 107b, for example. The part placement decision unit 105c decides placement positions of part feeders for common parts used in all board types to be produced, based on the data registered in the database 107. The simulation unit 105d simulates a production time required to produce necessary boards, and displays the simulation result in a graph. Note that the guidance unit 105b is one example of a storing possibility judgment unit and a guidance unit in the claims attached with this description.

Figure 8:
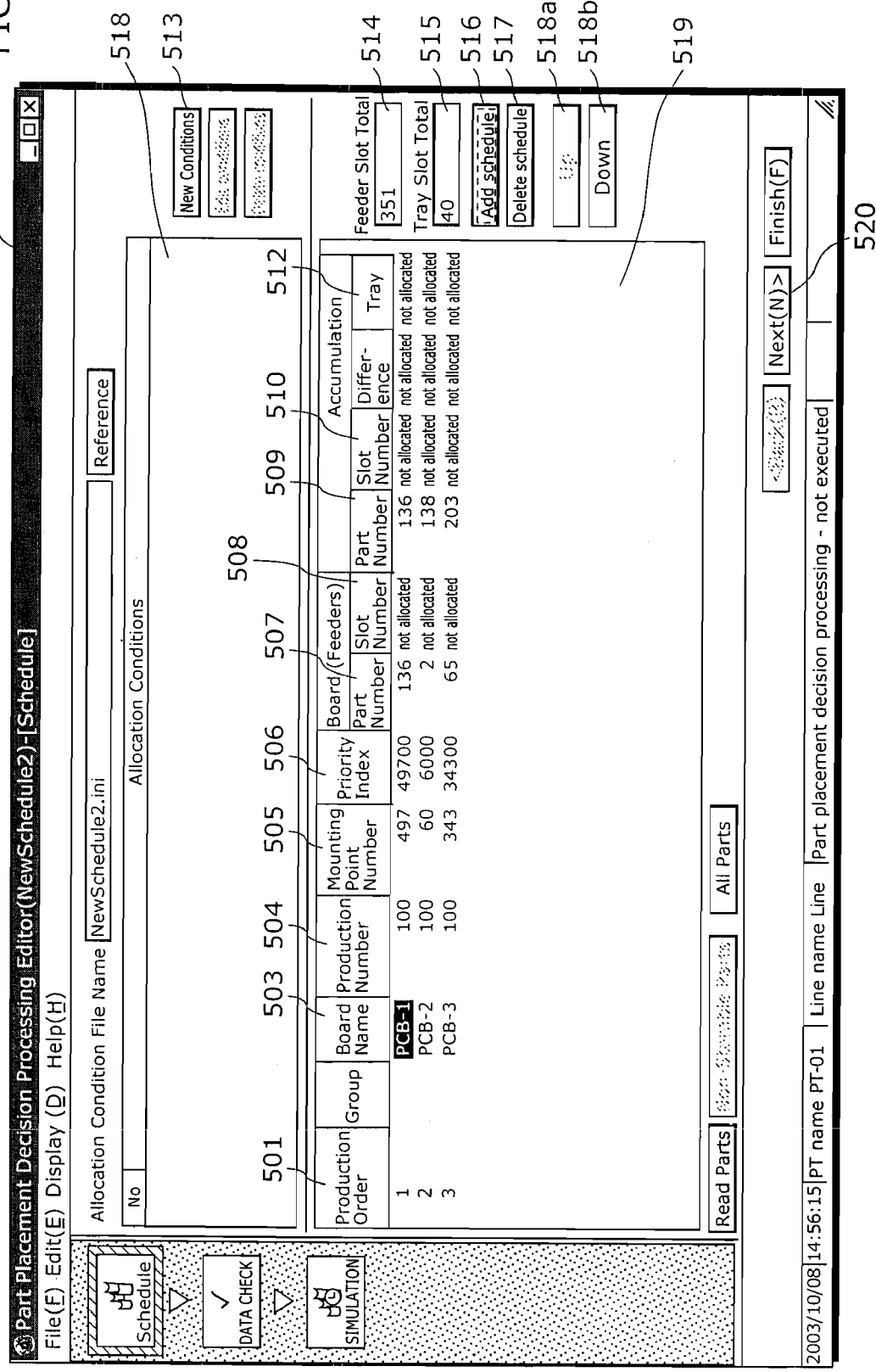
FIG. 8 is a diagram showing one example of a screen whose display is generated and displayed by a schedule unit.

Next, processing performed by the data generation terminal apparatus 100 is described. Here, a typical operation screen (hereafter, referred to simply as "screen") 500, which is realized by the display unit 102 and the input unit 103, is described with reference to FIG. 8. By the schedule unit 105a, the screen 500 as shown in FIG. 8 is displayed on the display unit 102.

The screen 500 is roughly divided into a region 518 displaying the allocation conditions 107b, and a region 519 displaying a schedule. Here, the schedule display region 519 shows that mounter data 107a of three board types are currently registered. The schedule is created by displaying names of the board types (mounter data name) in a production order. In the schedule display region 519, there are a production order column 501, a board name column 503, a production number column 504, a mounting point number column 505, a priority index column 506, a part number column 507, a slot number column 508, a part number column 509, a slot number column 510, a tray column 512, and the like.

The production order column 501 indicates a production order in which the board types to be produced are to be produced. The board name column 503 indicates a name of each board type to be produced (mounter data name). The production number column 504 indicates the number of boards 20 to be produced for each board type (hereinafter, referred to also as "production number"). The mounting point column 505 indicate the number of mounting points for each board 20 (hereinafter, referred to also as "mounting point number"). The priority index column 506 indicates a priority index which is a value obtained by multiplying the production number by the mounting point number. The priority index represents a significance degree of each board type. More specifically, the more the production number and the part mounting number of a certain board type are increased, the more a ratio of boards of this type to total boards to be produced is increased, so that a priority index of this board type is increased.

The part number column 507 indicates the number of part types used to produce a single board 20 (hereinafter, referred to also as "part number"). The slot number column 508 indicates the number of slots which are necessary to store part feeders 402 in the part supplying units 403 in the mounters, in order to produce a single board 20 (hereinafter, referred to also as "slot number"), when the part feeders 402 are allocated to the mounters as simulation.

The part number column 509 indicates an accumulated value of the part numbers in the part number column 507 (hereinafter, referred to also as "accumulated part number"). The slot number column 510 indicates an accumulated value of the slot numbers in the slot number column 508 (hereinafter, referred to also as "accumulated slot number"). The tray column 512 indicates an accumulated value of the number of trays necessary for the plural board types, when necessary parts are allocated to the trays in the mounters for the board types, as simulation.

For example, FIG. 8 shows that a type of boards 20 is the second in the production order, a name of the boards 20 is "PCB-2", a production number of the boards PCB-2 is 100 sheets, and a mounting point number for each of the boards PCB-2 is 60 points. It is also shown that there are two types of parts to be mounted on a single board PCB-2, and an accumulated part number of a single board PCB-1 and a single board PCB-2 are totally 138 types. This accumulated part number can be obtained, assuming that the number of common part types used in both the board PCB-1 and the board PCB-2 is 0. Here, 136 that is a part number of a single board PCB-1 is added with 2 that is a part number of a single board PCB-2, resulting in a total number 138 that is equal to a value shown in the part number column 509. Therefore, it is understood that there is no common part between the board PCB-1 and the board PCB-2. Thus, the part number column 509 displays a total number of part types used to produce all board types to be produced.

The screen 500 further includes a new condition button 513, a total feeder slot number column 514, a total tray slot number column 515, a schedule adding button 516, a schedule deleting button 517, and order replacing buttons 518a and 518b.

The operator can set new allocation conditions by pressing the new condition button 513 using the input unit 103. The total feeder slot number column 514 displays a total number of the part feeders 402, which can be stored in the part supplying units 403 of the mounters included in the mounting line 300. That is, as described above, it is indicated that totally 351 part feeders 402 can be stored in the part supplying units 403.

The total tray slot number column 515 indicates a total number of slots which can be stored in the mounters included in the mounting line 300. That is, as described above, it is indicated that a total number of the slots is 40.

The schedule adding button 516 is a button for adding new mounter data into the schedule display region 519. The schedule deleting button 517 is a button for deleting certain displayed mounter data from the schedule display region 519. The order replacing buttons 518a and 518b are buttons for changing the production order of the board types displayed in the schedule display region 519.

Figure 9:
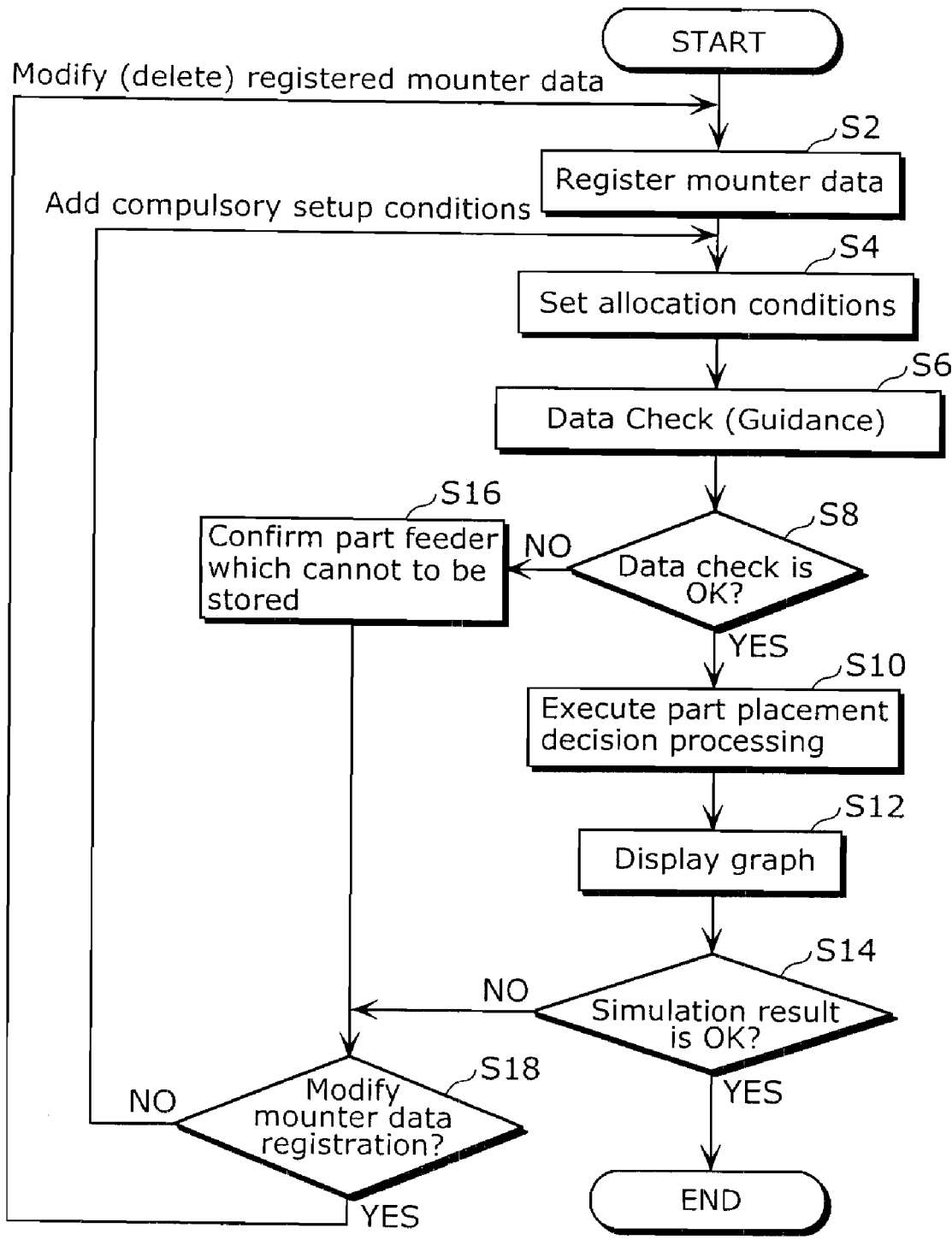
FIG. 9 is a flowchart of processing performed by a data generation terminal apparatus.

FIG. 9 is a flowchart of the processing performed by the data generation terminal apparatus 100. Using the input unit 103, the operator presses the schedule adding button 516 on the screen 500, and inputs a new board type name to be produced, in the board name column 503, so that mounter data 107a regarding a type of the new boards 20 is registered on the screen 500. Then, the schedule unit 105a registers, onto the database 107, the mounter data 107a regarding the boards 20 on which parts are to be mounted (S2). On the other hand, if the operator selects one of the board type names in the board name column 503, and presses the schedule deleting button 517, the schedule unit 105a deletes mounter data 107a of the selected board type from the database 107.

Next, using the input unit 103, the operator presses the new condition button 513 and inputs allocation conditions 107b. Then, the schedule unit 105a sets the allocation conditions 107b to the database 107 (S4). Note that it is also possible to delete allocation conditions 107b. The allocation conditions are, for example, conditions under which small-sized parts are to be mounted by a so-called high-speed mounter that is arranged in the upstream of the mounting line 300 and is able to mount such small-sized parts at a high speed. Note that, in the allocation of the part types, if a certain part type is used for plural board types, the part type is allocated in an identical mounter in respective producing of the board types. A specific example of the setting of the allocation conditions 107b is described further below.

If the operator presses a Next button 520, the guidance unit 105b judges whether or not the part feeders 402 for the board types to be produced can be stored in the part supplying units 403 in the mounting line 300 at the same time (S6).

Figure 10:
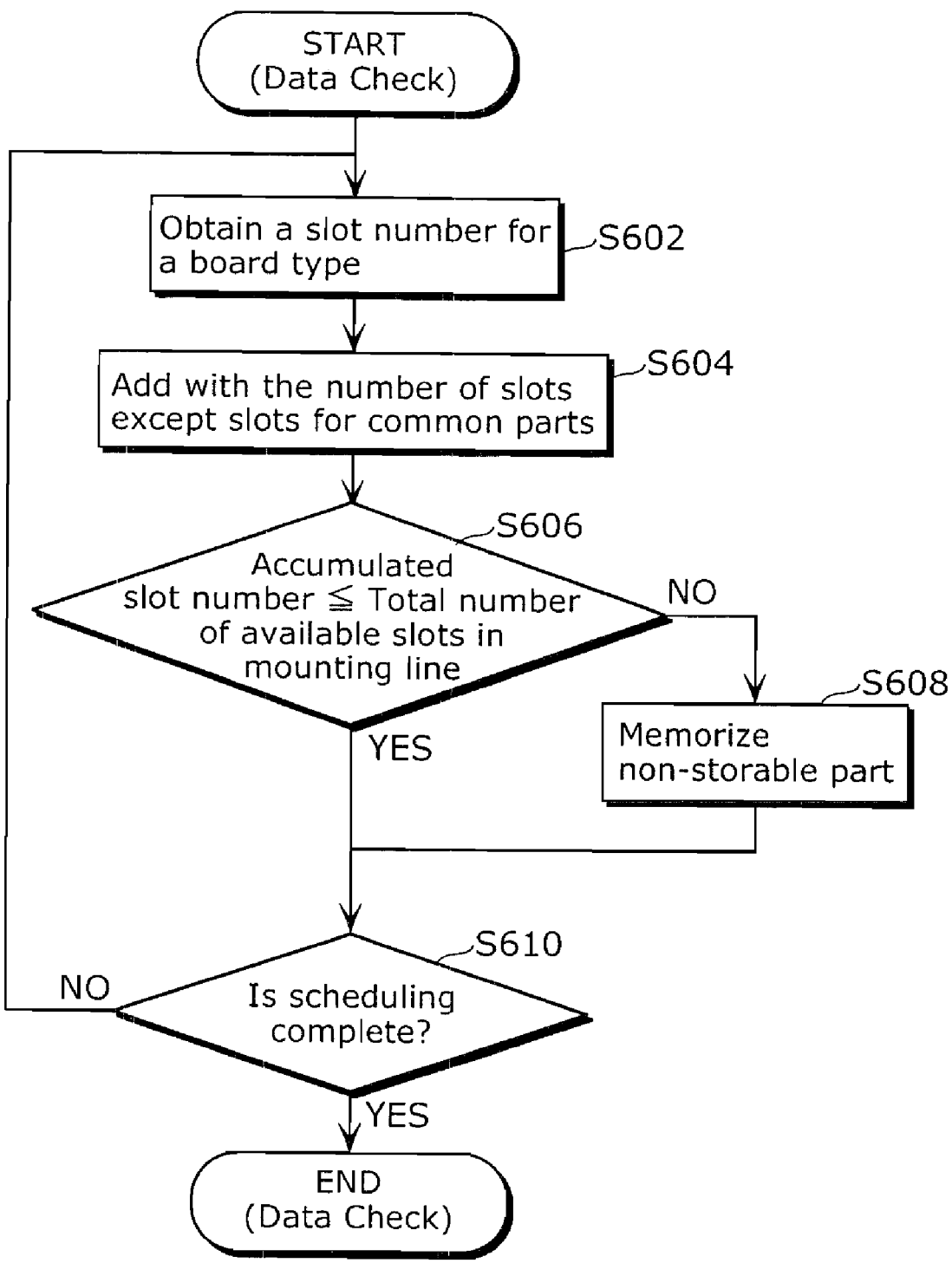
FIG. 10 is a flowchart showing one example of judgment processing (S6 in FIG. 9)

FIG. 10 is a flowchart showing one example of the judgment processing (S6 of FIG. 9).

The guidance unit 105b obtains a slot number for a certain board type, which is necessary to store part feeders 402 for the certain board type to be produced into the part supplying units 403 in the mounters (S602). Next, the guidance unit 105b adds a current accumulated slot number, with the slot number which is obtained at step S602 but subtracted with the number of slots for common parts (S604). Note that an initial number of the accumulated slot number is "0".

The guidance unit 105b judges whether or not the accumulated slot number is equal to or less than the total number of slots in the mounting line 300 (S606).

If the accumulated slot number is over the total number of slots, in other words, if there is any part feeder 402 which cannot be stored in the mounting line 300 (hereinafter, referred to also as "non-storable part feeder) (No at S606), then the guidance unit 105b memorizes a name of a part type corresponding to the non-storable part feeder 402 (S608).

Then, the guidance unit 105b judges whether or not the steps S606 and S608 are performed for all board types (S610), and if there is any board type for which the judgment is not performed (No at S610), then the processing is repeated from the step S602 for the board type.

By performing the above-described processing, the guidance unit 105b judges whether or not the part feeders 402 of all board types to be produced can be stored in the part supplying units 403 in the mounting line 300 at the same time.

Figure 11:
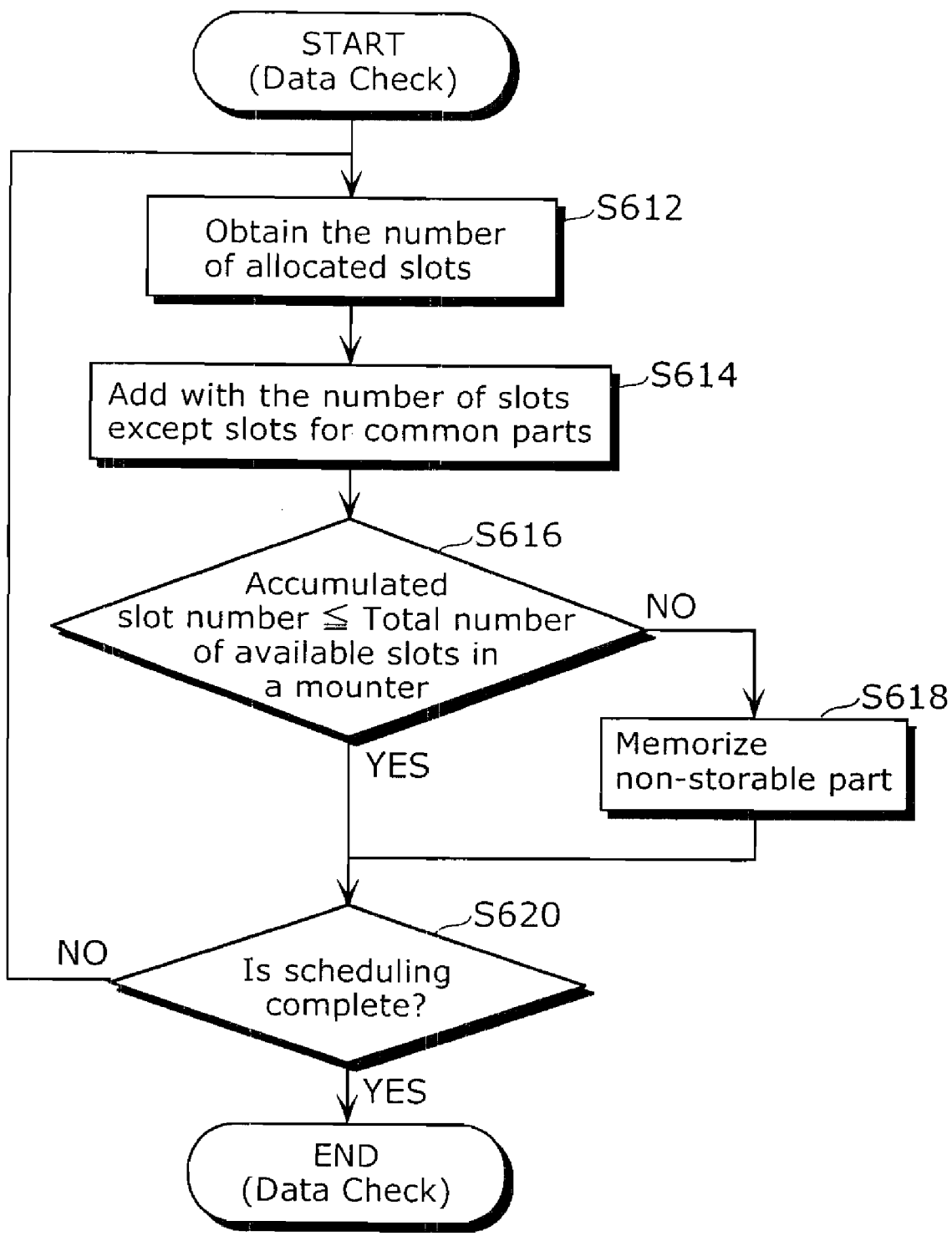
FIG. 11 is a flowchart showing another example of the judgment processing (S6 in FIG. 9)

Note that, instead of or in addition to the judgment processing shown in FIG. 10, judgment processing according to a flowchart shown in FIG. 11 may be performed. In the processing shown in FIG. 11, a judgment is made so as to whether or not there is any part which cannot be stored in the mounting line 300, after allocating parts used for all board types to the mounters in the mounting line 300, according to the allocation conditions inputted at step S4.

As shown in FIG. 11, the guidance unit 105b obtains, for each mounter, the number of slots storing part feeders 402 to which parts are allocated according to the allocation conditions set by at Step S4 (S612). Next, the guidance unit 105b adds a current accumulated slot number with the number of slots which is obtained at step S612 but subtracted with the number of slots for common parts (S614). Note that an initial value of the accumulated slot number is "0".

The guidance unit 105b judges whether or not the accumulated slot number is equal to or less than the total number of available slots in a current mounter (S616).

If the accumulated slot number is greater than the total number of available slots in the current mounter, in other words, if there is any part feeder 402 which cannot be stored in the mounter (No at S616), then the guidance unit 105b memorizes a name of a part type corresponding to the non-storable part feeder 402 (S618).

Then, the Guidance unit 105b judges whether or not the steps S616 and S618 are performed for all mounters (S620). If there is still any mounter for which these steps are not yet performed (No at Step 620), then the steps from S612 are repeated for the mounter.

Figure 12:
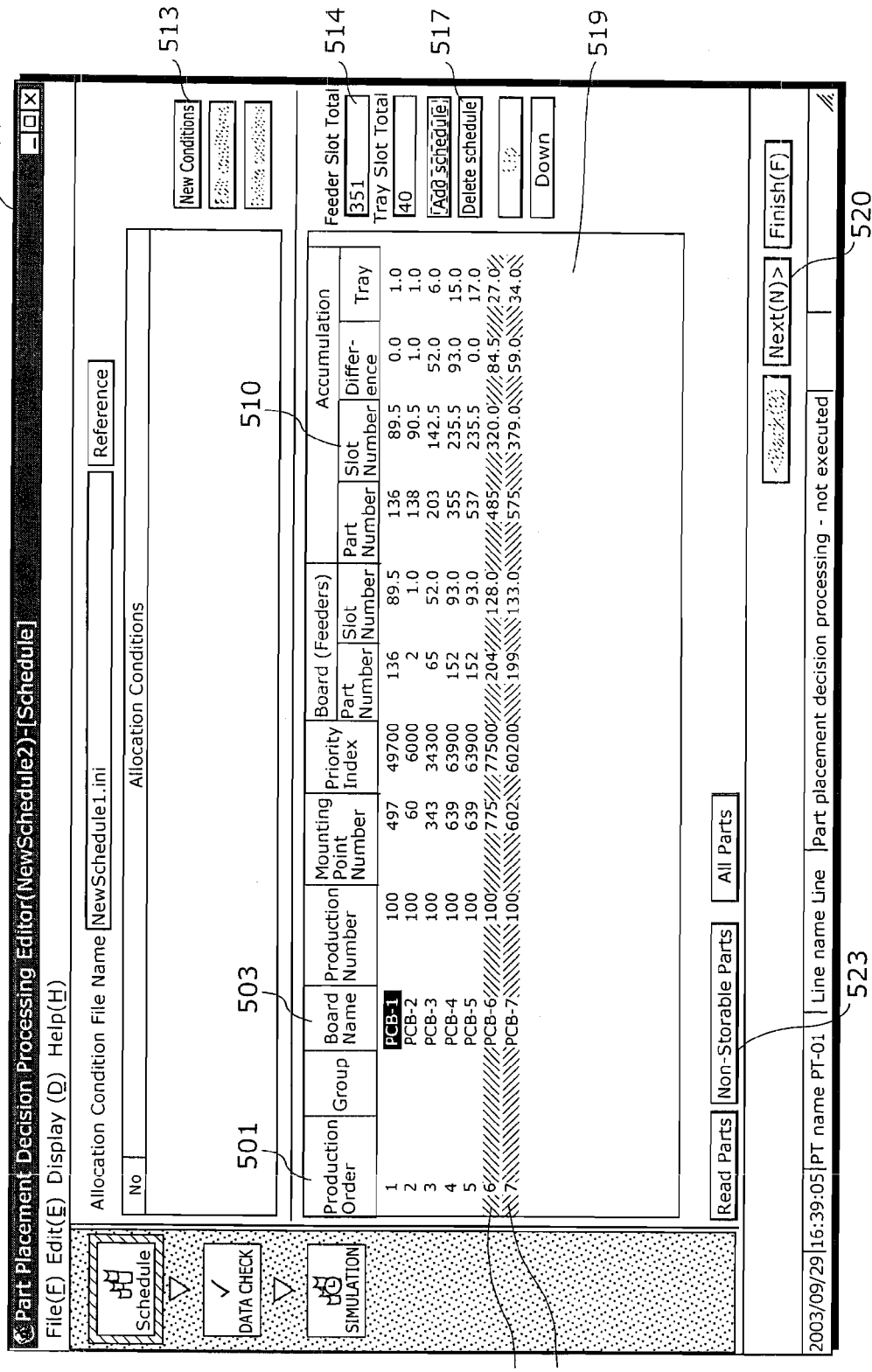
FIG. 12 is a diagram showing one example of screen whose display is generated and displayed by a guidance unit.

As a result of the judgment processing (S6 of FIG. 9), the guidance unit 105b makes the display unit 102 display the screen 500 as shown in FIG. 12. FIG. 12 shows that, on the screen 500, the schedule display region 519 displays a production schedule for producing seven types of boards 20. Here, data in a row 521 regarding a board type PCB-6 in the sixth production order, and data in a row 522 regarding a board type PCB-7 in the seventh production order, are displayed by different hatching which are not applied for data in other rows.

Here, it is assumed that board types PCB-1 to PCB-7 are to be sequentially produced based on the production schedule set at the steps S2 and S4. As shown in the slot number column 510, an accumulated slot number of the board type PCB-7 is 379 that is greater than 351 that is a total number of slots in the mounting line 300 indicated in the total feeder slot number column 514. Therefore, it is understood that all part feeders 402 necessary to produce the seven types of boards are not able to be stored in the part supplying units 403 of the mounting line 300 at once. This means that, if subsequent part placement decision processing is performed to decide placement positions of part feeders 402 for common parts, the part placement decision processing fails.

On the other hand, if it is assumed that the boards PCB-1 to PCB-6 are to be sequentially produced, an accumulated slot number of the board type PCB-6 in the slot number column 510 becomes 320 which is less than 351 that is the total slot number. Therefore, it is possible to set all part feeders 402 necessary to produce the six board types in the part supplying units 403 of the mounting line 300 at once. However, the above example is still not in a preferable situation. For instance, even though each mounter has each specialty, large-sized parts are to be mounted by a so-called high-speed mounter which can mount small-sized parts at a high speed, which is not a preferable situation. In the above example, the judgment of FIG. 10 is made that all necessary part feeders 402 can be stored in the mounting line 300 at once. However, the judgment of FIG. 11 is made that there are still parts which cannot be stored in any part feeder 402, when parts used for all board types are allocated to the mounters according to the allocation conditions. In such a case, if the board types to be produced are PCB-1 to PCB-6, the part placement decision processing is successful.

If the operator sees the screen 500 as shown in FIG. 12 and judges that the part placement decision processing will be successful (YES at S8), then the operator presses the Next button 520 so that the part placement decision unit 105c performs the part placement decision processing (S10). Here, in a situation shown in FIG. 12, the part placement decision processing will fail from the reason as described above. In such a situation, if the operator judges that the part placement decision processing will fail (NO at S8), then the part placement decision processing will become successful, only after that the operator deletes mounter data 107a corresponding to a certain board type, from plural mounter data 107a registered in the database 107, or only after that the operator adds, during production of the boards, conditions for compulsory setup which is processing for interchanging tape feeders.

For successful part placement decision processing, the operator firstly presses a non-storable part button 523 to display a which part feeder 402 for parts are not able to be stored in any part supplying unit 403 (S16). Note that the part feeder 402 for the non-storable parts has been memorized at Step S608 of FIG. 10 or at Step S618 of FIG. 11. Such part feeder 402 is, for example, a part feeder 402 which cannot be stored in any part supplying unit 403 of the mounting line 300 at the same time, among part feeders 402 for all board types to be produced, or a part feeder 402 which cannot be stored in a part supplying unit 403 of a mounter, after part feeders 402 for parts used in all board types are allocated to the mounters according to the allocation conditions. Note that, in order to specify the non-storable part feeder 402, the specifying is not necessary to be performed in the production order of the board types, but is able to be performed in any order. For example, the processing for specifying the non-storable part feeder 402 may be performed in an order of board types whose value in the priority index column 506 (priority index) is greater, on the screen 500 in FIG. 8. Thereby, the smaller the priority index is, the more the part feeder 402, which corresponds to a part used in a board type having the priority index, is likely to be specified as the non-storable part feeder 402.

Figure 14:
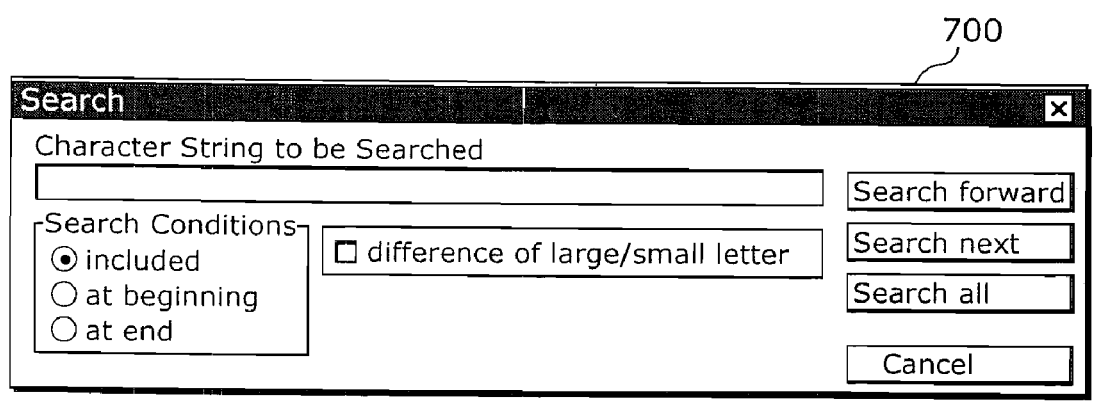
FIG. 14 is a diagram showing one example of a search window.

FIG. 13 is a diagram showing one example of a screen 600 displaying a list of the non-storable parts. The screen 600 displays data regarding the part feeders 402 which are not able to be stored for the board type PCB-7. Note that, by operating a button 601, the operator can display this kind of information for other board types. Further, by pressing a search button 602, the operator can display a search window 700 as shown in FIG. 14 to search certain data displayed on the screen 600. By searching data, it is possible to confirm whether or not a part feeder 402 for a certain name part type is non-storable. After confirming the data regarding non-storable part feeders, if, for example, it is understood that only part feeders 402 for small-sized parts cannot be stored in any part supplying unit 403, then the operator can decide to add compulsory setup conditions for a high-speed mounter, in order to set allocation conditions 107b. Further, if most of the non-storable part feeders 402 are used for a specific board type, the operator can decide to delete mounter data 107a regarding the specific board type from the database 107.

If the operator decides to delete the mounter data 107a regarding the specific board type, in other words, if the operator decides to modify the schedule (YES at S18), then the operator presses the OK button 603 on the screen 600 of FIG. 13 in order to display again the screen 500 as shown in FIG. 12. Then, when the operator selects a board name of the specific board type and presses the schedule deleting button 517, the schedule unit 105a deletes mounter data 107a regarding the board type from the database 107 (S2). After that, the processing proceeds to the steps from Step S4.

Figure 15:
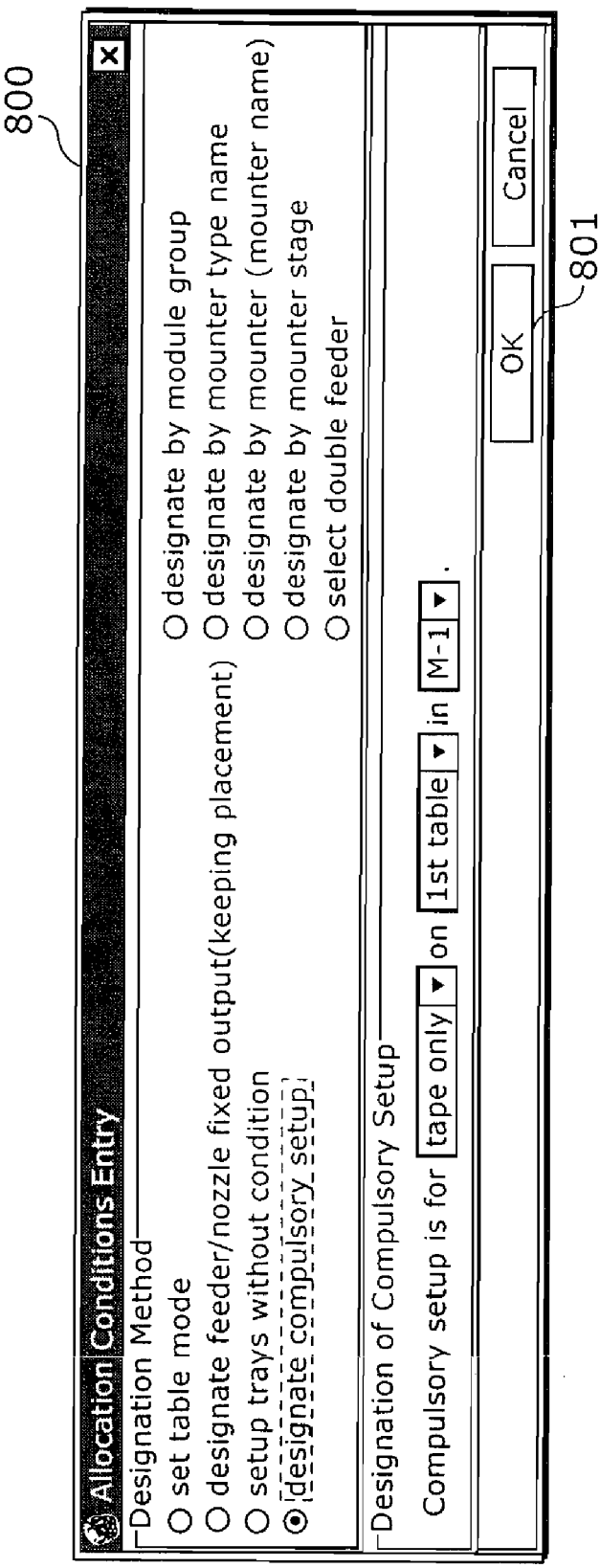
FIG. 15 is a diagram showing one example of a window on which allocation conditions is inputted.

On the other hand, if the operator decides to add compulsory setup conditions as allocation conditions 107b, in other words, if the operator decides not to modify the schedule (NO at S18), then the operator presses the new condition button 513 on the screen 500 of FIG. 12 in order to display a window 800 on which the allocation conditions as shown in FIG. 15 can be inputted. Here, when the operator designates compulsory setup conditions which is one of the allocation conditions, and presses an OK button 801, the schedule unit 105a sets the designated allocation conditions 107b to the database 107 (S4). Here, in this example, allocation conditions 107b, under which only tapes in the first table of the mounter M-1 is to be set up compulsorily, is added to the database 107. The "table" is another name of the part supplying unit 403. Moreover, in the part supplying unit 403, the "table" also means a unit and all parts in the unit can be interchanged at once. More specifically, by removing a cart from each table, it is possible to change all parts feeders in the table.

For example, as shown in FIG. 3, the mounter M-1 has four part supplying units, which are assumed to be assigned with numbers as a first table to fourth table, respectively, from lower left to upper right. Regarding the other mounters, such a table number is also assigned to each table.

Note that the compulsory setup is not necessarily designated for each table as described above. For example, the compulsory setup may be designated for each mounter. Further, the compulsory setup may be designated for each slot of part feeder, or for each group of slots.

After that, the processing is repeated from Step S6.

Figure 16:
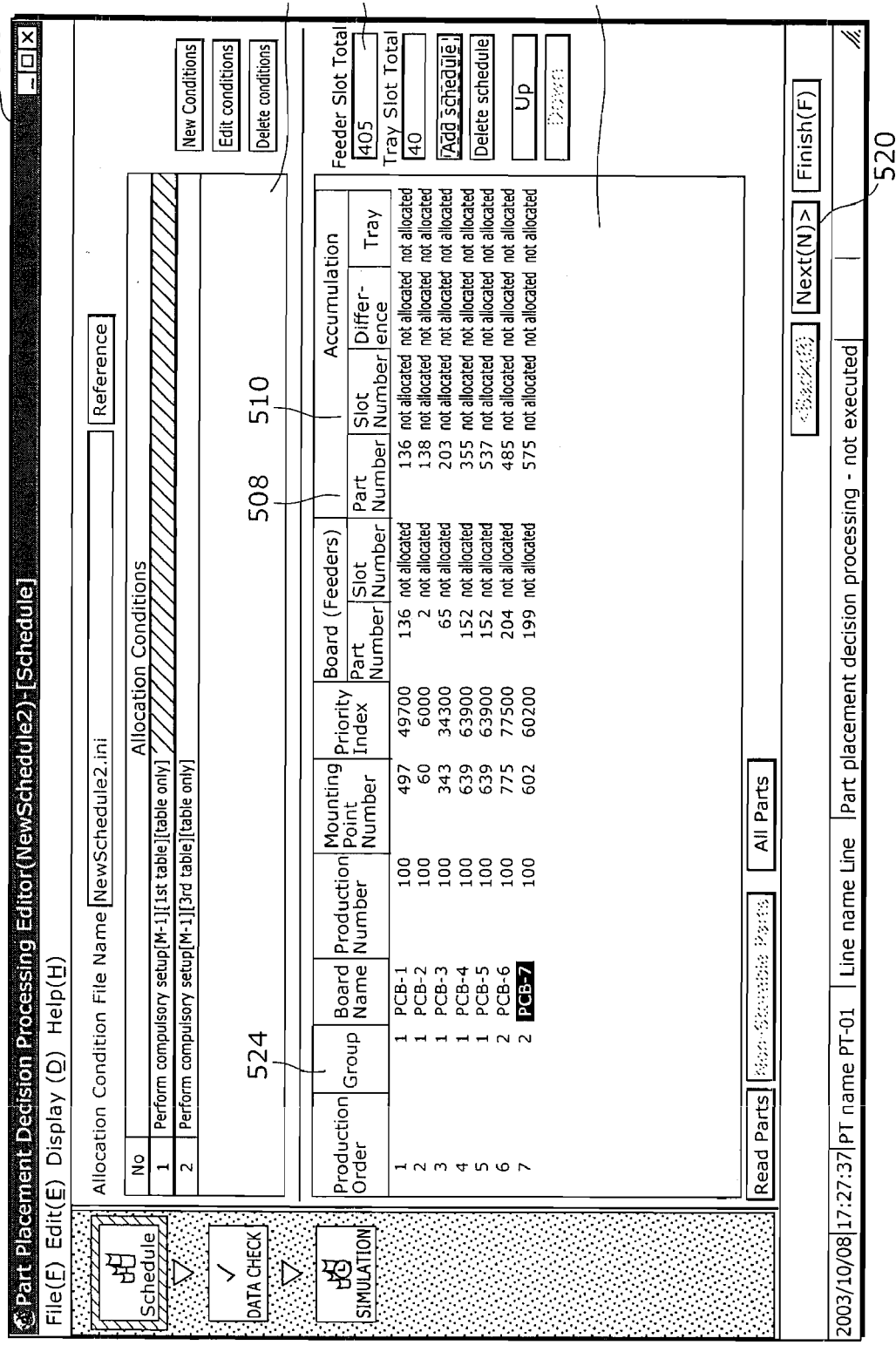
FIG. 16 is a diagram showing one example of a screen after setting allocation condition setting processing.

FIG. 16 is a diagram showing one example of the screen 500 after the allocation condition setting processing (S4). On the screen 500, in the region 518 indicating allocation conditions 107b, allocation conditions regarding two compulsory setups are added a total slot number indicated in the total feeder slot number column 514 is increased by 54, namely from 351 to 405. This total slot number is obtained assuming that the two setups are performed for the part supplying units 403, so that the part supplying units 403 are added with two more part supplying units 403. Note that, in the schedule display region 519, the slot number column 508, the slot number column 510, and the like indicate "not-allocated", which means that each slot number is not certain because the step S6 is not yet performed.

Further, among the seven types of boards 20 indicated in the group column 524, the board types PCB-1 to PCB-5 are defined as the first group, and the board types PCB-6 and PCB-7 are defined as the second group. This means that a setup can perform after production of the boards PCB-5, and after the setup, the production of the boards PCB-6 starts. Note that, this grouping is performed automatically by the schedule unit 105a when the allocation conditions are set. Note also that the grouping example shown in FIG. 16 is made for the first allocation conditions 107b, and for the second allocation conditions 107b, similar grouping is made.

As described above, if the operator judges that the part placement decision processing will be successful (YES at S8), then the operator presses the Next button 520 so that the part placement decision unit 105c performs the part placement decision processing. The part placement decision processing is performed by the conventional method. Therefore, details of the part placement decision processing are not described again here.

Figure 17:
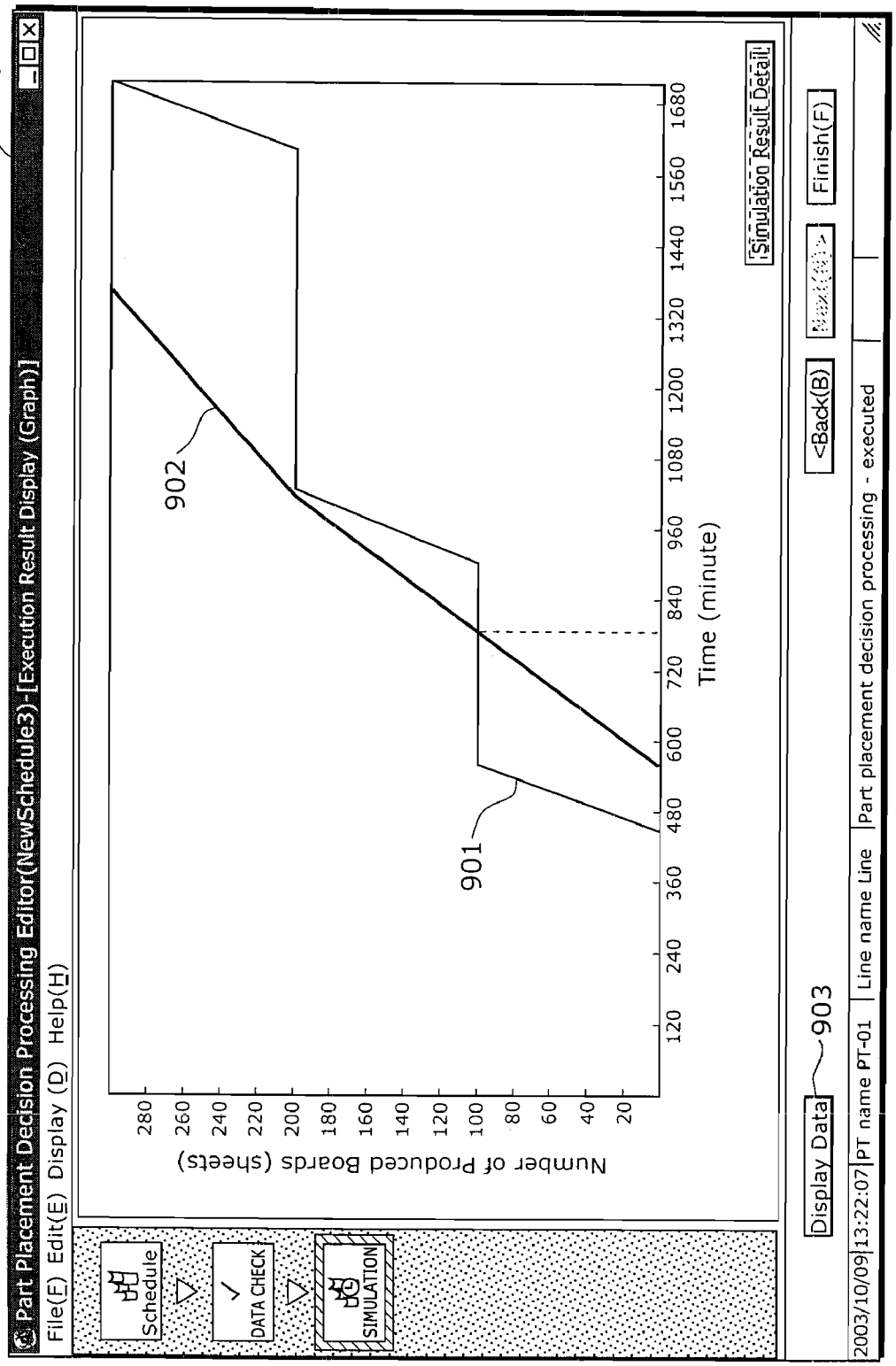
FIG. 17 is a diagram showing one example of a graph of a simulation result.

After performing the part placement decision processing, the simulation unit 105d simulates a tact time required to produce the boards, based on the mounter data 107a and the allocation conditions 107b registered in the database 107, and then displays a graph 900 as shown in FIG. 17 showing the simulation result, on the display unit 102 (S12). The method of the simulating is an existing technology. For example, the methods disclosed in Japanese Patent Application Laid-Open No. 2003-23300 and the like can be used.

In the graph 900, a horizontal axis represents a time, and a vertical axis represents the number of produced boards. Further, a solid line 901 shows a relationship between a time required for production and the number of produced boards, without executing the part placement decision processing. A solid line 902 shows a relationship between a time required for production and the number of produced boards, after executing the part placement decision processing.

When the operator presses a display data button 903 during displaying the graph 900, the simulation unit 105d displays an execution result display screen 1000 for displaying simulation results as shown in FIG. 18. On the execution result display screen 1000, a simulation result regarding a whole production plan, and a simulation result regarding each board type are displayed.

Figure 19:
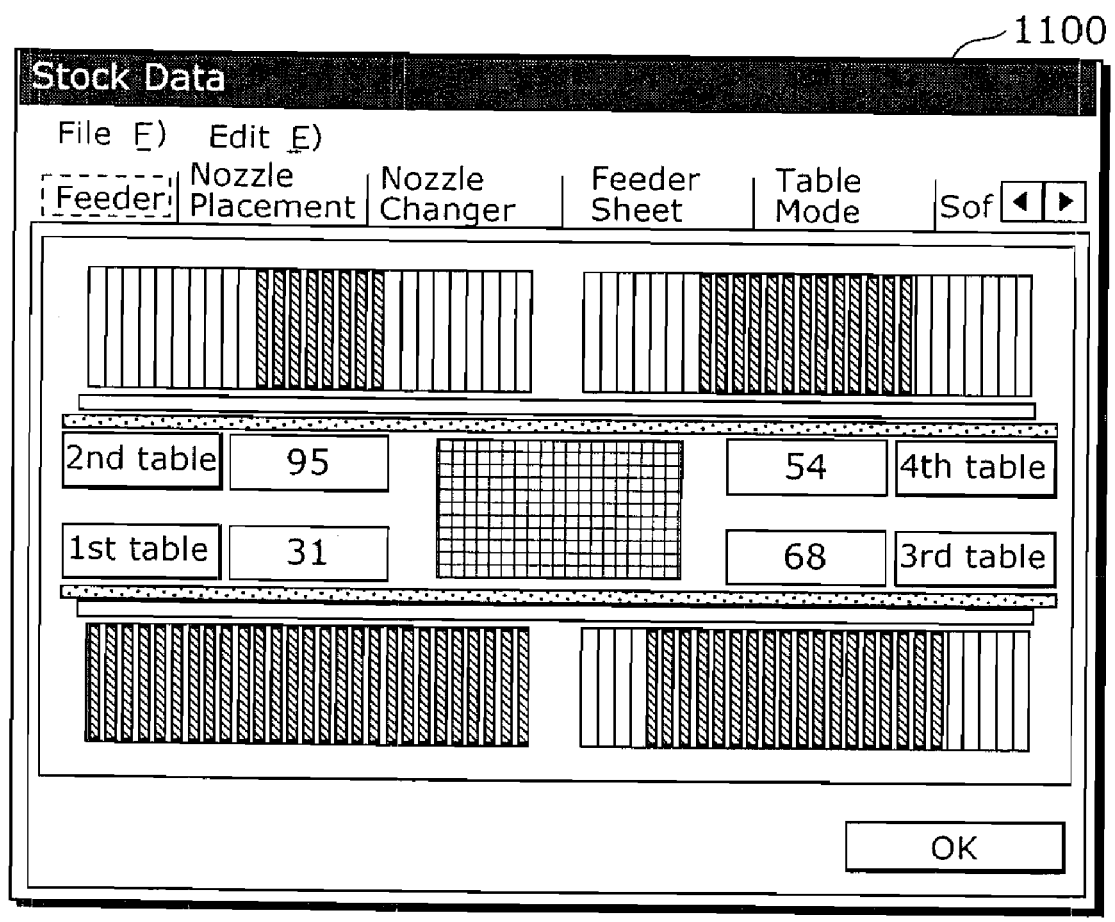
FIG. 19 is a diagram showing one example of a stock data display screen.

On this execution result display screen 1000, when the operator clicks a column 1001 displaying a simulation result regarding a specific mounter for a specific board type, the simulation unit 105d displays a stock data display screen 1100 as shown in FIG. 19, on the display unit 102.

On the stock data display screen 1100, placement positions of part feeders 402 in the part supplying units 403 of the mounter M-1 regarding production of the boards PCB-4, for example, are displayed in hatchings.

Figure 20:
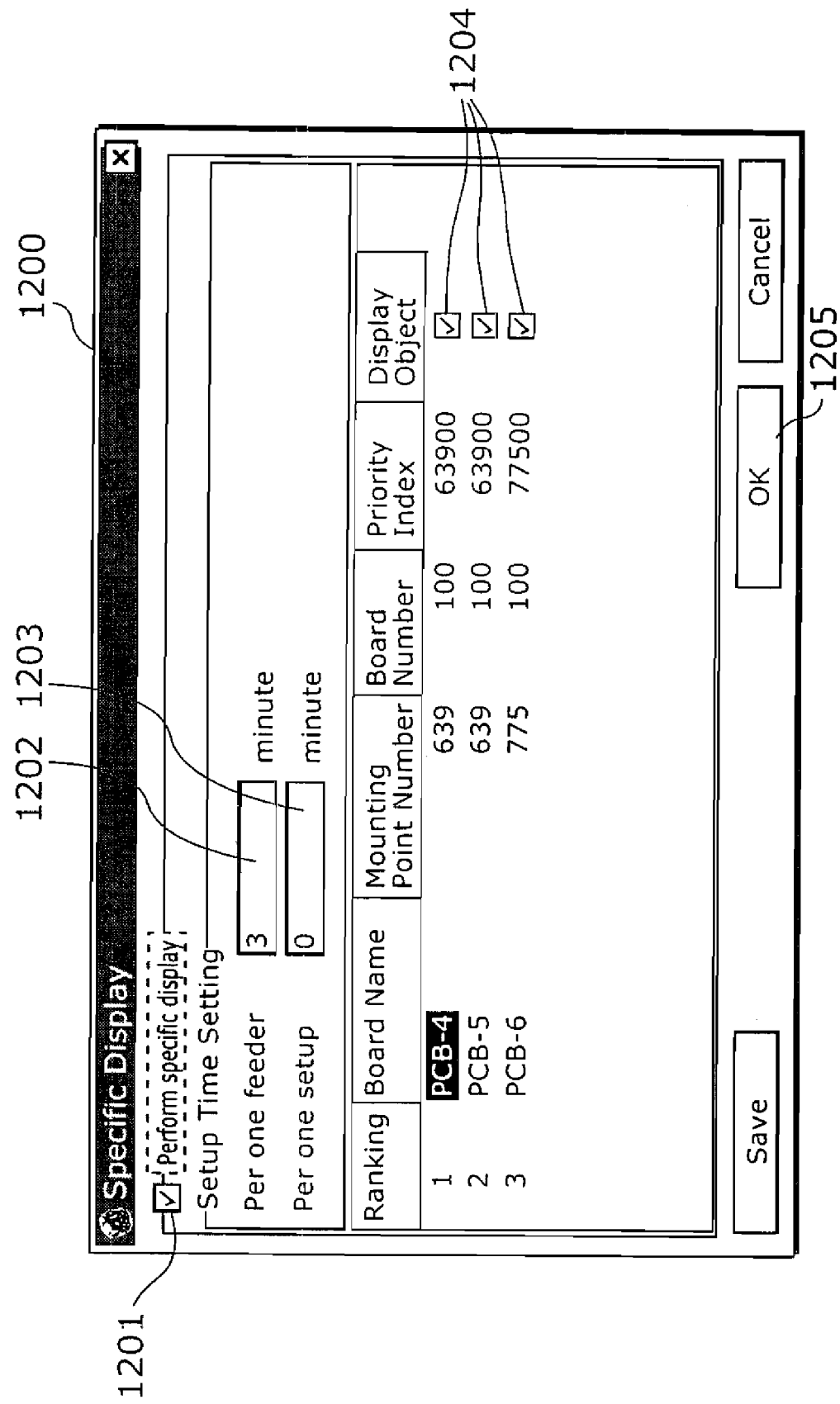
FIG. 20 is a diagram showing one example of a specific display screen.
Figure 21:
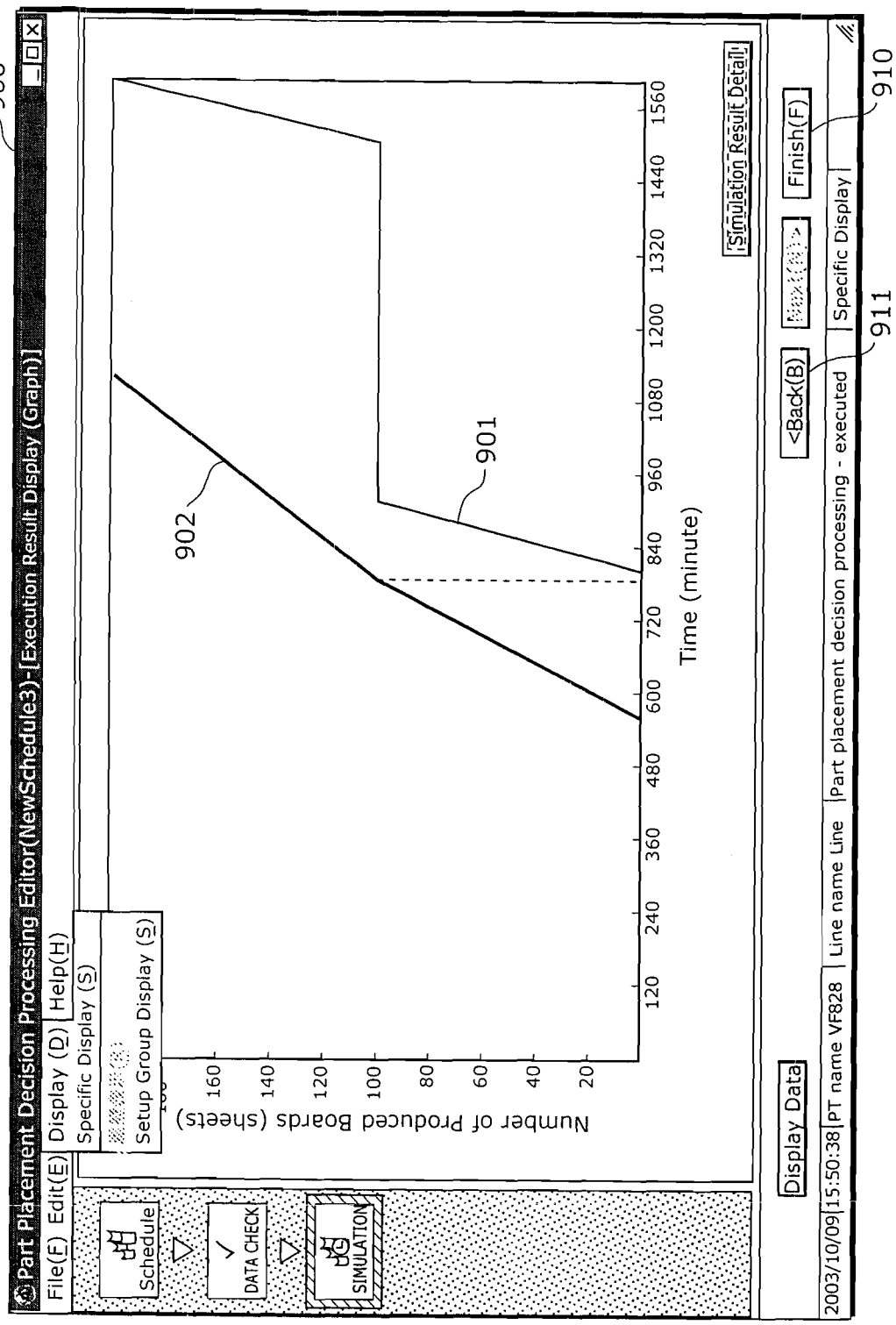
FIG. 21 is a diagram showing one example of a graph of a simulation result.

Moreover, if on the execution result display screen 1000 the operator selects an item "specific display" from a "Display" menu, the simulation unit 105d displays a specific display screen 1200 as shown in FIG. 20, on the display unit 102. By inputting a numeric value in input column 1202 or 1203 on the specific display screen 1200, the operator can re-set a setup time required to set up a single pert feeder 402, or a setup time required to set up a single part supplying unit 403. Further, by selecting a check box 1204, it is possible to select a board type to be displayed. Furthermore, by checking a check box 1201 and pressing an OK button 1205, simulation is performed based on the re-set conditions, and a graph 900 as shown in FIG. 21 is displayed. Further, a time required to produce a single board and the like are already obtained by the simulation, so that the result can be used to create the graph.

If the operator sees the graph 900 and is satisfied with the simulation result, then by pressing a Finish button 910 (YES at S14) a series of the steps is completed.

On the other hand, if the operator is not satisfied, then by pressing a Back button 911 (NO at S14), the screen 500 is again displayed so that modification of the mounter data 107a, addition of allocation conditions 107b, and the like are performed again.

As described above, according to the embodiment of the present invention, without conventionally performing the processing for deciding placement positions of the part feeders, it is possible to determine whether or not the part feeders can be stored in the part supplying units at the same time, which makes it possible to make a production schedule of boards in a short time.

Note that in the embodiment of the present invention, the mounting line has been described as above, but the present invention is not limited to the embodiment.

For example, only one mounter may be included in the mounting line.

Further, the function, which the data generation terminal apparatus has, may be in the line management terminal apparatus or the mounter included in the mounting line.

INDUSTRIAL APPLICABILITY

The present invention can be applied to, for example, an apparatus which decides production conditions, under which a mounter for mounting electronic parts on a printed board is operated.

The invention claimed is:

1. A production condition determining method of determining production conditions under which various types of boards are to be produced,
wherein under initial conditions of the production conditions, all of necessary part feeders are to be stored simultaneously in a part supplying unit in a mounter, the necessary part feeders being used to produce the various types of boards, and the mounter producing the various types of boards,
said method comprising:
judging whether or not all of the necessary part feeders can be stored simultaneously in the part supplying unit, by comparing the number of the necessary part feeders, with the number of part feeders which can be stored in the part supplying unit; and
outputting a guidance for modifying the production conditions so that the various types of boards can be produced, when the judgment is made that all of the necessary part feeders cannot be stored simultaneously in the part supplying unit,
wherein said judging includes:
obtaining the number of part feeders used to produce a board of each type;
calculating the number of the necessary part feeders, in which the number of part feeders commonly used to produce boards of two or more types is known from said obtaining and counted as one; and
checking whether or not all of the necessary part feeders can be stored simultaneously in the part supplying unit, by comparing the number of the necessary part feeders obtained in said calculating, with the number of part feeders which can be stored in the part supplying unit.

2. The method according to claim 1, further comprising
displaying information for specifying any of the part feeders which cannot be stored simultaneously in the part supplying unit, according to the judgment in said judging.

3. The method according to claim 1,
wherein the production conditions include conditions for designating the part supplying unit in which the part feeder is to be stored, and
in said judging,
the number of part feeders used in production performed by each mounter is obtained in consideration of the production conditions.

4. The method according to claim 1,
wherein in said outputting, information is displayed to specify any of the part feeders which cannot be stored simultaneously in the part supplying unit, according to the judgment in said judging.

5. The method according to claim 1,
wherein in said outputting, guidance is displayed to set interchanging of the part feeders stored in the part supplying unit, when one of the board types is switched to another one of the board types to be produced.

6. The method according to claim 1,
wherein in said outputting, guidance is displayed to set deleting of one of the board types not to be produced.

7. The method according to claim 1, further comprising
determining the production conditions for the various types of boards, according to an instruction inputted by an operator regarding the displaying of said outputting.

8. The method according to claim 7, further comprising
simulating production of the various types of boards, by calculating a time period required for the production under the production conditions determined in said determining.

9. The method according to claim 8, further comprising:
receiving an input of a time period required to interchange the part feeders; and
re-simulating the production by re-calculating the time period required for the production, based on the time period required for the interchanging in said receiving and a result of said simulating.

10. A production condition determining apparatus which determines production conditions under which various types of boards are to be produced,
wherein under initial conditions of the production conditions, all of necessary part feeders are to be stored simultaneously in a part supplying unit in a mounter, the necessary part feeders being used to produce the various types of boards, and the mounter producing the various types of boards,
said apparatus comprising:
a storing possibility judgment unit operable to judge whether or not all of the necessary part feeders can be stored simultaneously in the part supplying unit, by comparing the number of the necessary part feeders, with the number of part feeders which can be stored in the part supplying unit; and
a guidance unit operable to output a guidance for modifying the production conditions so that the various types of boards can be produced, when the judgment is made that all of the necessary part feeders cannot be stored simultaneously in the part supplying unit,
wherein said storing possibility judgment unit includes:
an obtaining unit operable to obtain the number of part feeders used to produce a board of each type;
a calculation unit operable to calculate the number of the necessary part feeders, in which the number of part feeders commonly used to produce boards of two or more types is known from said obtaining unit and counted as one; and
a checking unit operable to check whether or not all of the necessary part feeders can be stored simultaneously in the part supplying unit, by comparing the number of the necessary part feeders obtained by said calculation unit, with the number of part feeders which can be stored in the part supplying unit.

11. A mounter which mounts a part onto a board to eventually produce various types of boards, and determines production conditions under which the various types of boards are to be produced,
wherein under initial conditions of the production conditions, all of necessary part feeders are to be stored simultaneously in a part supplying unit in said mounter, the necessary part feeders being used to produce the various types of boards,
said mounter comprising:
a storing possibility judgment unit operable to judge whether or not all of the necessary part feeders can be stored simultaneously in the part supplying unit, by comparing the number of the necessary part feeders, with the number of part feeders which can be stored in the part supplying unit; and
a guidance unit operable to output a guidance for modifying the production conditions so that the various types of boards can be produced, when the judgment is made that all of the necessary part feeders cannot be stored simultaneously in the part supplying unit, wherein said storing possibility judgment unit includes:

an obtaining unit operable to obtain the number of part feeders used to produce a board of each type;

a calculation unit operable to calculate the number of the necessary part feeders, in which the number of part feeders commonly used to produce boards of two or more types is known from said obtaining unit and counted as one; and a checking unit operable to check whether or not all of the necessary part feeders can be stored simultaneously in the part supplying unit, by comparing the number of the necessary part feeders obtained by said calculation unit, with the number of part feeders which can be stored in the part supplying unit.

12. A program, which is recorded on a computer-readable recording medium, for determining production conditions under which various types of boards are to be produced, wherein under initial conditions of the production conditions, all of necessary part feeders are to be stored simultaneously in a part supplying unit in a mounter, the necessary part feeders being used to produce the various types of boards, and the mounter producing the various types of boards, said program causing a computer to execute a method comprising:

judging whether or not all of the necessary part feeders can be stored simultaneously in the part supplying unit, by comparing the number of the necessary part feeders, with the number of part feeders which can be stored in the part supplying unit; and outputting a guidance for modifying the production conditions so that the various types of boards can be produced, when the judgment is made that all of the necessary part feeders cannot be stored simultaneously in the part supplying unit, wherein said judging includes:

obtaining the number of part feeders used to produce a board of each type;

calculating the number of the necessary part feeders, in which the number of part feeders commonly used to produce boards of two or more types is known from said obtaining and counted as one; and checking whether or not all of the necessary part feeders can be stored simultaneously in the part supplying unit, by comparing the number of the necessary part feeders obtained in said calculating, with the number of part feeders which can be stored in the part supplying unit.

* * * * *